United States Patent [19]
Nakamura et al.

[11] Patent Number: 5,689,258
[45] Date of Patent: Nov. 18, 1997

[54] MULTIPLE CURRENT DIGITAL-ANALOG CONVERTER CAPABLE OF REDUCING OUTPUT GLITCH

[75] Inventors: Yasuyuki Nakamura; Hiroyuki Kouno; Takahiro Miki, all of Hyogo, Japan

[73] Assignee: Mitsubishi Denki Kabushiki Kaisha, Tokyo, Japan

[21] Appl. No.: 532,315

[22] Filed: Sep. 21, 1995

[30] Foreign Application Priority Data

Nov. 18, 1994 [JP] Japan ................................ 6-285233

[51] Int. Cl.$^6$ .............................................. H03M 1/66
[52] U.S. Cl. ................................... 341/136; 341/144
[58] Field of Search ........................ 341/136, 126, 341/144

[56] References Cited

U.S. PATENT DOCUMENTS

| | | | |
|---|---|---|---|
| 4,563,669 | 1/1986 | Petschacher et al. | 341/126 |
| 4,725,813 | 2/1988 | Miyada | 341/136 |
| 5,148,164 | 9/1992 | Nakamura et al. | 341/136 |
| 5,331,322 | 7/1994 | Cha et al. | 341/136 |
| 5,373,294 | 12/1994 | Sun | 341/136 |
| 5,406,135 | 4/1995 | Kasai et al. | 327/108 |
| 5,450,084 | 9/1995 | Mercer | 341/136 |

FOREIGN PATENT DOCUMENTS 2-105727  4/1990  Japan.

OTHER PUBLICATIONS

"A 130–MHz 8–b CMOS Video DAC for HDTV Applications" Fournier et al., IEEE Journal of Solid–State Circuits, vol. 26, No. 7, Jul. 1991, pp. 1073–1077.

"A 10 bit 80MHz Glitchless CMOS D/A Converter" Takakura et al., IEEE 1991 Custom Integrated Circuits Conference, pp. 26.5.1–26.5.4.

Primary Examiner—Jeffrey A. Gaffin
Assistant Examiner—Thuy-Trang N. Huynh
Attorney, Agent, or Firm—Lowe, Price, LeBlanc & Becker

[57] ABSTRACT

A digital-analog converter has unit current source cells each having a differential switch circuit and a constant current source. The differential switch circuit made of two switches is driven by a pair of complementary driving circuits controlled by a bit signal and the inverted bit signal corresponding to that signal and entered simultaneously. The constant current source outputs a constant current to a first and a second current output terminal via the switch circuit. The signals for controlling the driving circuits that drive the switches are such that the delay time for the switch closing operation will be longer than the delay time for the switch opening operation. As a result, the cross point of the two signals to open and close the switches in a complementary manner becomes greater than the median between the maximum and minimum signal levels. That is, even when the threshold value of a currently switching transistor is greater than a median, that value may be arranged to match the median, whereby the furnished switching transistors are not turned on or off simultaneously.

16 Claims, 25 Drawing Sheets

MULTIPLE CURRENT DIGITAL-ANALOG CONVERTER CAPABLE OF REDUCING OUTPUT GLITCH

BACKGROUND OF THE INVENTION

1. Field of the Invention

The present invention relates to a digital-analog converter for converting digital input signals to analog signals corresponding to digital values. More particularly, the invention relates to a multiple current digital-analog converter which comprises a plurality of unit current source cells and which connects to an output terminal the output currents of as many unit current source cells as the digital value of a digital input signal, whereby the current values are summed and the resulting value is acquired as an analog output.

2. Description of the Related Art

FIG. 34 is a schematic block diagram of a conventional multiple current segment-type digital-analog converter 800 for converting n-bit digital input data to an analog signal. For the sake of explanation, it is assumed hereunder that n=3, i.e., the digital input data is three-bit data.

The digital-analog converter 800 has seven unit current sources $CS_1$–$CS_7$ ($=2^3-1$) corresponding to the resolution of a three-bit input signal (b3, b2, b1). In the converter 800, a digital input circuit 101 decodes the digital input signal (b3, b2, b1) and connects to the output terminal $I_{out}$ of the converter 800 the output terminals of as many unit current sources as the decimal number of the digital input signal ($=2^0 \times b1 + 2^1 \times b2 + 2^2 \times b3$).

Decoded signals $Q_1$–$Q_7$ and their inverted counterparts $/Q_1$–$/Q_7$ acquired via an inverter 81 activate driving circuits $D_1$–$D_7$ and $/D_1$–$/D_7$ in a complementary manner. This turns on and off switching transistors Q21–Q27 and Q31–Q37, connecting and disconnecting the respective unit current sources to and from the output terminal $I_{out}$ or $/I_{out}$.

For example, suppose that the digital input data (b3, b2, b1) is (0, 1, 0). In that case, the driving circuits $D_1$ and $D_2$ turn on the switching transistors Q21 and Q22 for selecting two unit current sources $CS_1$ and $CS_2$ and connect the selected unit current sources to the output terminal $I_{out}$. In this setup where the decimal notation of the input data (0, 1, 0) is 2, the output terminal $I_{out}$ is supplied with a current twice as large as that fed from one unit current source.

Suppose that the digital input data is (1, 1, 1). In that case, the switching transistors Q21–Q27 are all turned on to select all unit current sources $CS_1$–$CS_7$. This causes a full-scale analog current value to appear at the output terminal $I_{out}$.

Each unit current source, its corresponding inverter, its pair of switching transistors and its pair of driving circuits constitute a unit current source cell. In FIG. 34, for the sake of simpler illustration, only the unit current source cell corresponding to the unit current source $CS_1$ is indicated by a broken line block 801. Needless to say, the unit current source cells corresponding to the other unit current sources $CS_2$–$CS_7$ have the same constitution.

It is in the manner outlined above that the multiple current segment type digital-analog converter provides an analog output corresponding to the digital input signal.

Conventional multiple current digital-analog converters have one disadvantage in common. That is, the so-called glitch occurs in the output current, as will be described below.

FIG. 35 is a detailed circuit diagram of the unit current source cell 801 constituting part of the conventional multiple current digital-analog converter of FIG. 34.

In FIG. 35, one of the decoded signals $Q_i$ (i=1, 2, ..., $2^n-1$) in FIG. 34 is represented by reference character S. The i-th unit current source cell 801 is made of driving circuits $D_i$ and $/D_i$, an inverter 81, an n-channel MOSFET Q1i that functions as the unit current source $CS_i$, and n-channel MOSFETs Q2i and Q3i. The drain of the n-channel MOSFET Q1i is connected to the sources of the n-channel MOSFETs Q2i and Q3i. The gate of the n-channel MOSFET Q1i is fed with an appropriate potential from a terminal VG1i. The setup allows the unit current source $CS_i$ to output a constant current value Io ($=I^i_{out}+/I^i_{out}$). The source of the n-channel MOSFET Q1i is connected to a grounding potential $V_{ss}$.

The n-channel MOSFETs Q2i and Q3i are turned on and off when their respective gates are supplied with mutually complementary signals Y and Z. Acting in this manner, the transistors activate or deactivate the supply of currents to the output terminals $I^i_{out}$ and $/I^i_{out}$.

The driving circuit $D_i$ is an inverter that has the drains of an n-channel MOSFET M1i and a p-channel MOSFET M2i connected in series. The gates of these transistors are interconnected to receive the signal S. The commonly connected drains of the two transistors output the driving signal Y. The source of the p-channel MOSFET M2i is connected to a high-level signal potential VG2 (usually a supply voltage $V_{DD}$). The source of the n-channel MOSFET M1i is connected to a low-level signal potential VG2OFF (usually the grounding potential $V_{SS}$).

The driving circuit $/D_i$ is the same in constitution as the driving circuit $D_i$, except that an input signal SBAR is the inverted signal of the signal S, the inversion being carried out by the inverter 81.

FIG. 36 is a timing chart of the signals S and SBAR, and FIG. 37 is a timing chart of the driving signals Y and Z corresponding to those signals.

The signal SBAR lags behind the signal S by a time period corresponding to one inverter stage. In like manner, the driving signal Z lags behind the driving signal Y.

In this case, the threshold value for activation and deactivation of the switching transistors Q2i and Q3i is generally shifted higher than the median between VG2 and VG2OFF.

The reason for the above characteristic is as follows: where the n-channel MOSFET is located in a p-well formed on a silicon substrate, the operating speed of the n-channel MOSFET is enhanced by reducing the p-n junction capacitance occurring between the p-well and an n+ region that is the contact region of the source and the drain. This is generally achieved by feeding the p-well with a negative potential $V_{BB}$. As a result, the threshold value of the n-channel MOSFET is increased.

Thus as shown in FIG. 37, near each point where the leading and the trailing edge of the driving signals Y and Z intersect with each other, there occurs a region in which the n-channel MOSFETs Q2i and Q3i are turned on or off simultaneously. In particular, there occurs a growing period of time in which both transistors are simultaneously deactivated.

When the n-channel MOSFETs Q2i and Q3i are turned on simultaneously, the total current $I_o$ ($=I^i_{out}+/I^i_{out}$) flowing to the unit current source cells still remains constant. It means that the output terminals $I^i_{out}$ and $/I^i_{out}$ are each fed with about half the total current ($I_o/2$). What takes place here will be described in more detail with reference to FIG. 37.

Suppose that the signal Y is Low and the signal Z High. In this case, the output terminal $/I^i_{out}$ is supplied a the current equivalent to a single unit current source cell (no current flows to the terminal $I^i_{out}$ at this point). When the decoder signal S changes next, bringing the signal Y High and the signal Z Low, the switching transistors Q2i and Q3i both conduct. This causes the output terminal $/I^i_{out}$ be fed with a current equivalent to half the unit current source cell. When the signal Z is fixed to the low level, no current flows to the terminal $I^i_{out}$.

What becomes clear is as follows: in one current source cell, the glitch occurring in the time lag between the signal Y and signal Z corresponds to half the least significant bit. However, there generally exist a plurality of unit current source cells changing simultaneously. Thus the glitch generated as a whole is not negligible.

Likewise, when the n-channel MOSFETs Q2i and Q3i are turned off simultaneously, the output terminals $I^i_{out}$ and $/I^i_{out}$ are both fed with no current. With no current output where there should be a current output, this also causes the glitch.

One conventional apparatus for inhibiting the occurrence of the glitch triggered by the above-described signal time lag is proposed illustratively in Japanese Patent Laid-Open No. 2-105727. The proposed apparatus, as embodied in the publication, involves furnishing a latch circuit arrangement on the input side to eliminate the signal time lag through appropriate circuitry. FIG. 38 is a schematic block diagram of the proposed digital-analog converter.

In FIG. 38, a digital input circuit 102 receives digital input data and a clock signal $\phi_0$. A decoder 103 converts the data suitably, producing decoded digital input signals $L_{10}$, $/L_{10}$; ... ; $L_{n0}$, $/L_{n0}$; and latch control signals $\phi$, $/\phi$. The latch control signals $\phi$, $/\phi$, generated from the initial clock signal $\phi_0$, control the output timing of the control signals held temporarily in latch circuits 104. The temporarily held control signals are destined to differential switches $S_1$–$S_n$ constituting a differential switch circuit 105 of constant current sources IN1–INn.

The paired signals $L_{10}$ and $/L_{10}$, $L_{20}$ and $/L_{20}$, ..., $L_{n0}$ and $/L_{n0}$ are complementary in phase. When the temporarily held signals $L_{10}$, $/L_{10}$; ... ; $L_{n0}$, $/L_{n0}$ are output from the latch circuit 104 made of latches $LA_{1a}$, $LA_{1b}$; $LA_{2a}$, $LA_{2b}$; ..., $LA_{na}$, $LA_{nb}$, they become switch control signals $L_{11}$, $/L_{11}$; ... ; $L_{n1}$, $/L_{n1}$. The output timing of these signals to all the switches is determined by the common latch control signals $\phi$/$\phi$ as described above.

In this manner, the output timing is maintained for the paired control signals $L_{11}$, $/L_{11}$; ... ; $L_{n1}$, $/L_{n1}$ for the differential switch circuit 105. The differential switches $S_1$–$S_n$ act in a symmetrical manner with respect to the outputs $I_o$, $/I_o$. That is, all constant current sources IN1–INn connected to the first and the second current output terminal $I_o$, $/I_o$ are controlled by a pair of latch control signals $\phi$, $/\phi$. This arrangement is expected to inhibit the glitch observed in the example of FIG. 34.

FIGS. 39 and 40 are timing charts of the digital input signals $L_{10}$, $/L_{10}$ and switch control signals $L_{11}$, $/L_{11}$ corresponding to a single unit current source cell in the digital-analog converter of FIG. 38.

In FIGS. 39 and 40, the two complementary switching transistors are not turned on simultaneously, and are turned off together for a reduced period of time, unlike the case involving the time lag (FIGS. 36 and 37). However, if the threshold value for the switching transistors $M_{1a}$, $M_{1b}$ is shifted off the median between the high-level signal (VG2) and the low-level signal (VG2OFF) as mentioned, the simultaneously-deactivated state of the transistors is unavoidable and the glitch cannot be eliminated completely.

SUMMARY OF THE INVENTION

It is therefore an object of the present invention to provide a multiple current digital-analog converter comprising unit current source cells whose outputs are connected and disconnected by complementary switching transistors to and from output terminals, whereby the glitch stemming from the switching time lag is reduced for highly precise converter operation.

It is another object of the invention to provide a digital-analog converter of high precision allowing the switching time lag to be varied externally so as to minimize the occurrence of the glitch.

In carrying out the invention and according to one aspect thereof, there is provided a multiple current digital-analog converter for converting a digital input signal to a corresponding analog value current for output. The converter comprises a plurality of unit current source cells, and a current summing circuit for summing the output currents from the unit current source cells. Each of the unit current source cells comprises: a differential switch circuit including a first and a second switch; a constant current source for outputting a constant current to the current summing circuit via the differential switch circuit; a first driving circuit controlled by the bit signal corresponding to the digital input signal so as to open and close the first switch of the differential switch circuit; an inverter for generating an inverted bit signal by inverting the corresponding bit signal; and a second driving circuit for closing and opening the second switch of the differential switch circuit in a complementary manner with respect to the first switch. The driving operation to open the second switch is controlled by the corresponding bit signal and the driving operation to close the second switch is controlled by the inverted bit signal. In this setup, the current summing circuit sums the output currents from the unit current source cells in accordance with the digital input signal.

According to another aspect of the invention, there is provided a multiple current digital-analog converter for converting a digital input signal to a corresponding analog value current for output. The converter comprises: a signal output and holding circuit for receiving the bit signal corresponding to the digital input signal before the arrival of a first external timing signal and for outputting while simultaneously holding the corresponding bit signal and the bit signal acquired by inverting the corresponding bit signal after the arrival of the first external timing signal; a plurality of unit current source cells; and a current summing circuit for summing the output currents from the unit current source cells. Each of the unit current source cells comprises: a differential switch circuit including a first and a second switch; a constant current source for outputting a constant current to the current summing circuit via the differential switch circuit; and a first and a second driving circuit controlled by the corresponding bit signal and the inverted bit signal respectively in order to open and close the first and the second switch of the differential switch circuit in a complementary manner so that the delay time for the switch closing operation will be longer than the delay time for the switch opening operation. In this setup, too, the current summing circuit sums the output currents from the unit current source cells in accordance with the digital input signal.

According to a further aspect of the invention, there is provided a multiple current digital-analog converter for converting a digital input signal to a corresponding analog value current for output. The converter comprises: a signal output and holding circuit for receiving the bit signal corresponding to the digital input signal before the arrival of a first external timing signal and for outputting while simultaneously holding the corresponding bit signal and the bit signal acquired by inverting the corresponding bit signal after the arrival of the first external timing signal; a plurality of unit current source cells; and a current summing circuit for summing the output currents from the unit current source cells. Each of the unit current source cells comprises: a differential switch circuit including a first and a second switch; a constant current source for outputting a constant current to the current summing circuit via the differential switch circuit; a first and a second driving circuit controlled by the corresponding bit signal and the inverted bit signal respectively in order to open and close the first and the second switch of the differential switch circuit in a complementary manner; two transmission routes for transmitting the corresponding bit signal and the inverted bit signal to the first and the second driving circuit; and a driving circuit control circuit for switching relative to the first and the second driving circuit the two transmission routes in a complementary manner through the use of a second external timing signal. Also in this setup, the current summing circuit sums the output currents from the unit current source cells in accordance with the digital input signal.

As outlined, one major advantage of this invention is a significant reduction in the occurrence of glitch. In accordance with the digital input signal, the delay time for the switching operation to break the connection between the output terminals and the constant current source is longer than the delay time for making that connection. This eliminates the period in which the output current is turned off completely at the time of switching. Hence the reduced glitch.

Another advantage of this invention is its capability of allowing the delay time of the switching operation to be varied externally so as to minimize the occurrence of glitch. This delay-varying feature provides for a highly accurate digital-analog converter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
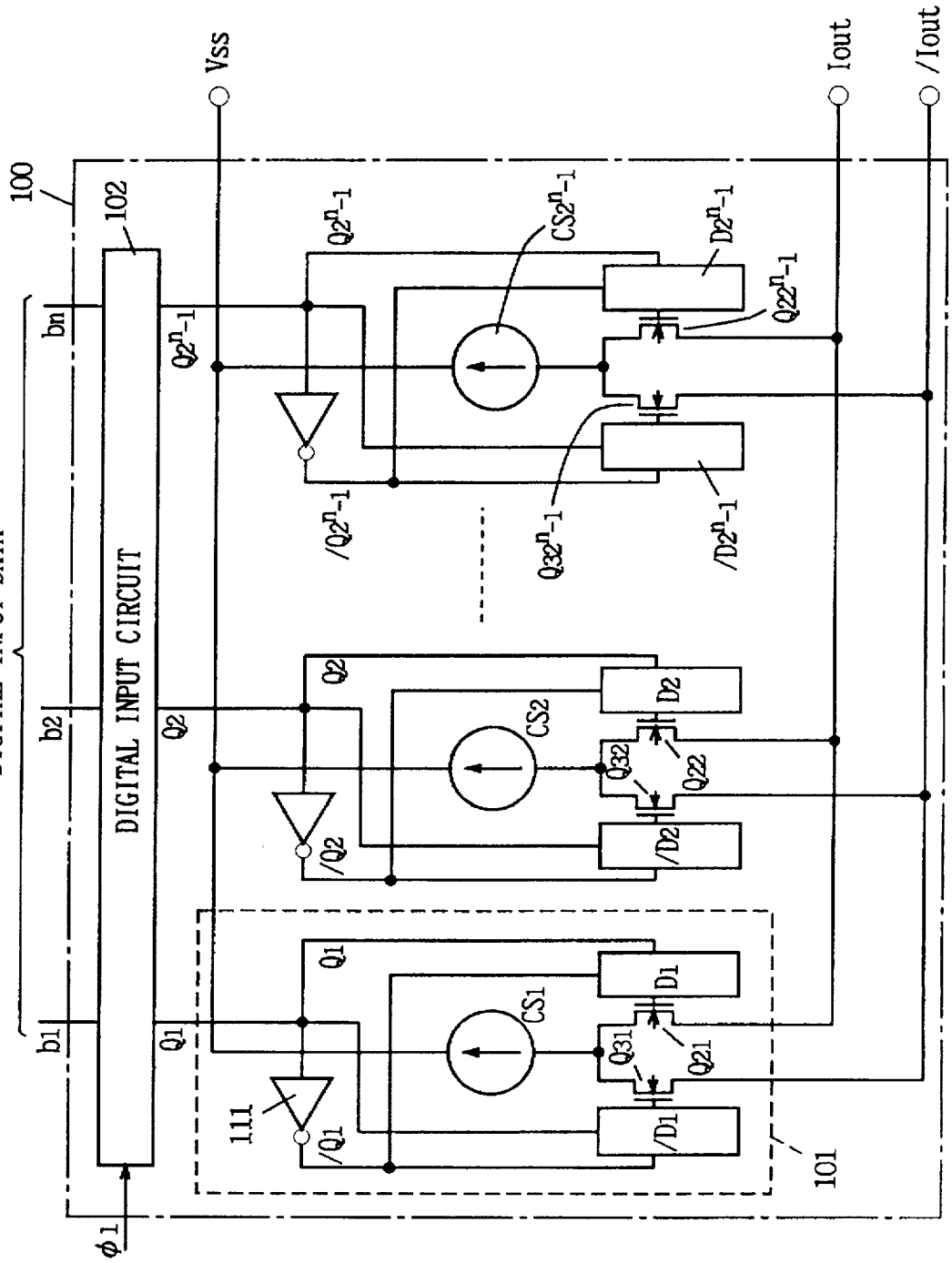
FIG. 1 is a schematic block diagram of a digital-analog converter practiced as a first embodiment of the invention.
Figure 34:
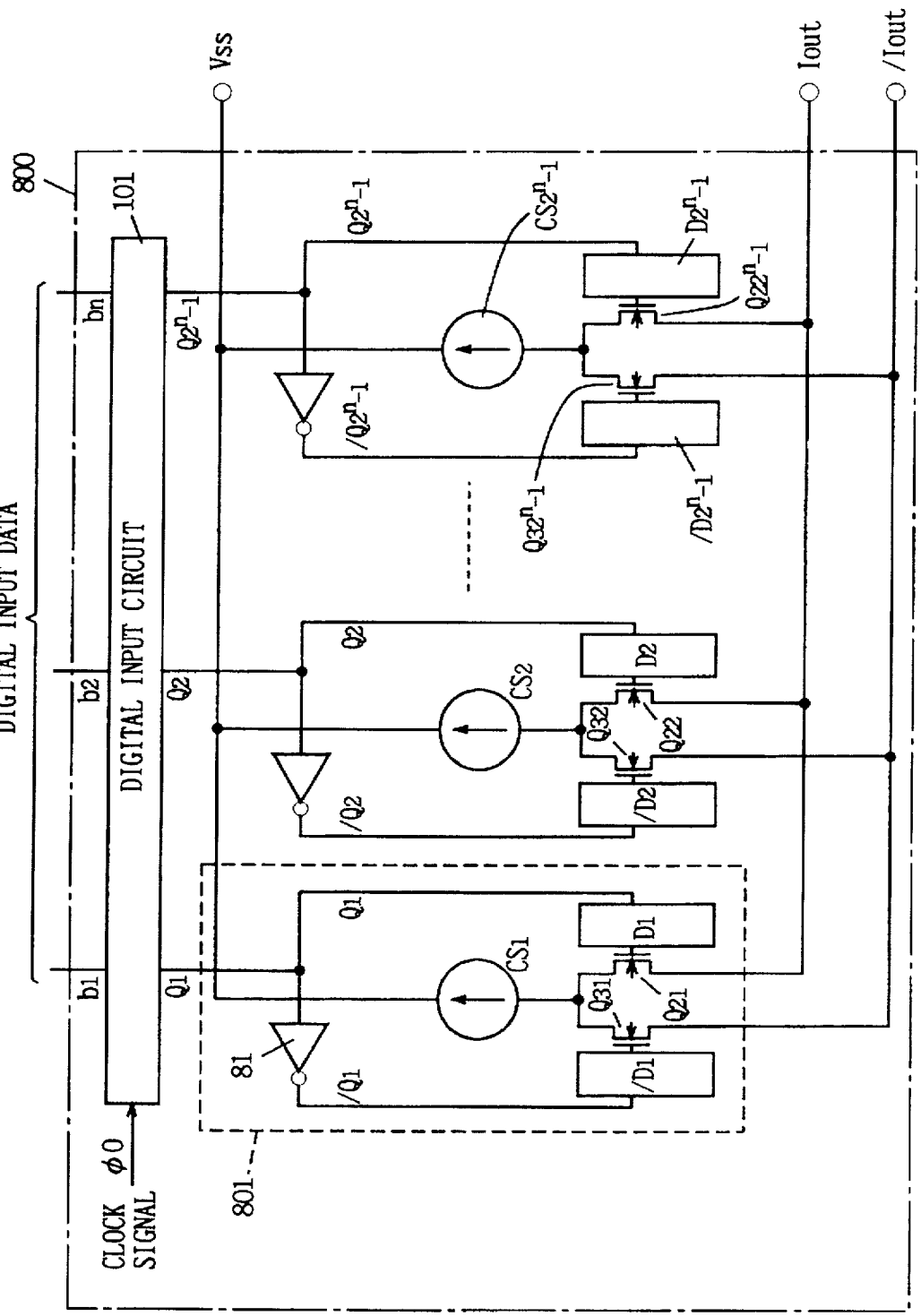
FIG. 34 is a schematic block diagram of a first conventional digital-analog converter.
Figure 35:
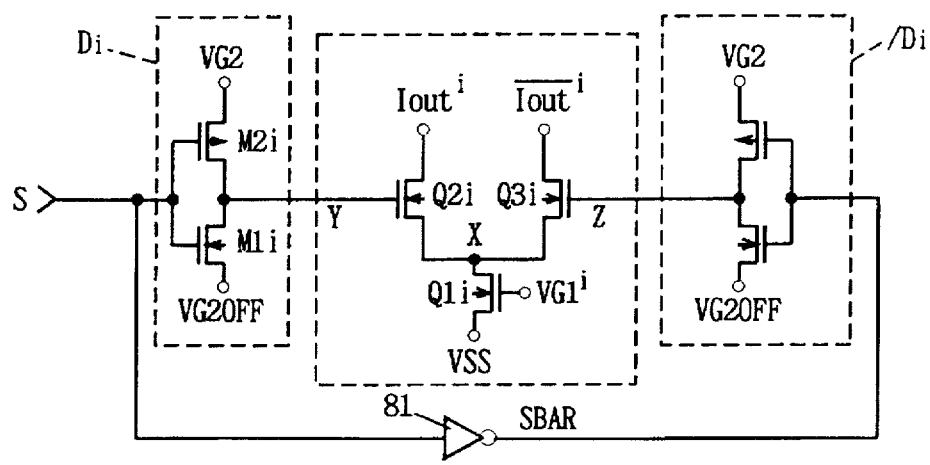
FIG. 35 is a circuit diagram of a conventional unit current source cell.
Figure 36:
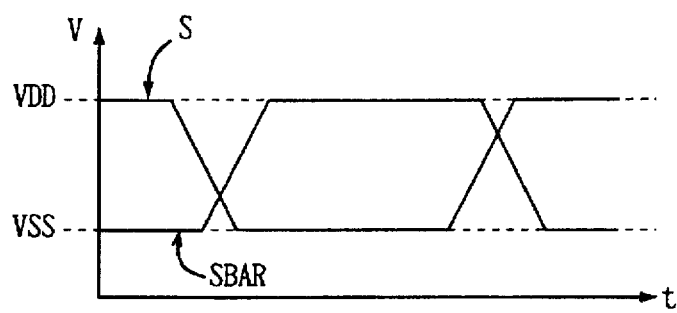
FIG. 36 is a timing chart of signals in effect when the first conventional converter works.

FIG. 1 is a schematic block diagram of a segment type multiple current digital-analog converter practiced as the first embodiment of the invention. The first embodiment of FIG. 1 is similar in constitution to the conventional converter of FIG. 34 with some notable exceptions which will be described below. In describing the first embodiment, the parts that are substantially the same in function as those already described in connection with the conventional converter will be designated by the same reference numerals and characters, and the descriptions of such parts will be omitted where redundant.

The signal $Q_i$ (i=1, 2, ..., $2^n-1$) decoded by the digital input circuit 102 is input not only to the driving circuit $D_i$ but also to the driving circuit $/D_i$ that performs the operation inverse to that of the circuit $D_i$. Meanwhile, the signal acquired by an inverter 111 inverting the signal $Q_i$ is input not only to the inversely operating driving circuit $/D_i$ but also to the driving circuit $D_i$.

Figure 2:
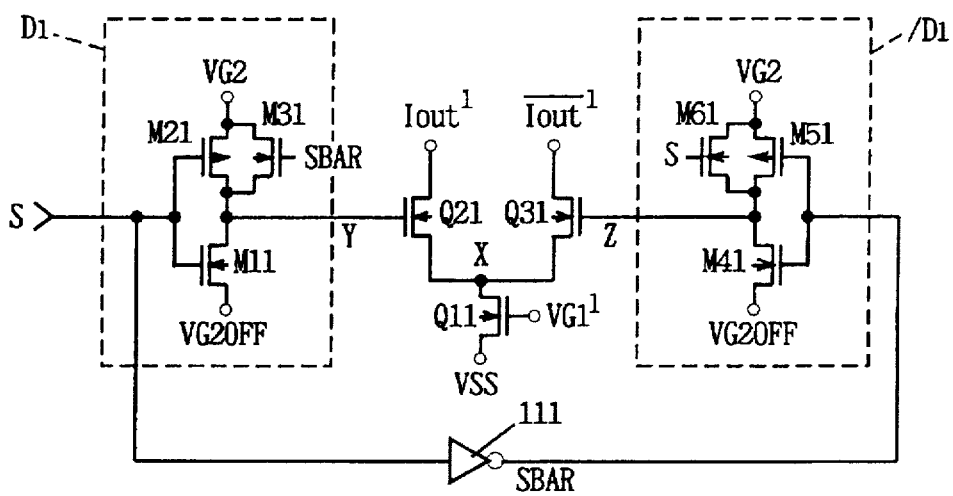
FIG. 2 is a circuit diagram of a unit current source cell in the first embodiment.

FIG. 2 is a circuit diagram of a unit current source cell 101 in the first embodiment. How the unit current source cell 101 works will now be described in more detail by referring to FIG. 2.

Reference character S represents hereunder the signal that is input to the unit current source cell 101. In FIG. 2, the driving circuit $/D_1$ is basically an inverter having the drains of a p-channel MOSFET M51 and an n-channel MOSFET M41 connected in series. The n-channel MOSFET M61 is connected parallelly to a p-channel MOSFET M51.

The gate of the p-channel MOSFET M51 is connected to that of the n-channel MOSFET M41. The common gate of the two transistors is supplied with a signal SBAR acquired by the inverter 111 inverting the signal S, the signal SBAR lagging behind the signal S. The signal S is input to the gate of the n-channel MOSFET M61.

In the above circuit constitution, when the driving circuit $/D_1$ is to output a signal Z (potential VG2) for opening a switching transistor Q31, the signal S (equivalent to potential $V_{DD}$) turns on the n-channel MOSFET M61. At this point, the p-channel MOSFET M51 is also turned on by the signal SBAR (equivalent to potential $V_{SS}$). However, since the signal SBAR lags behind the signal S by a time period corresponding to one inverter stage, the signal SBAR does not cause the signal Z to rise.

On the other hand, when the driving circuit $/D_1$ is to output a signal Z (potential VG2OFF) for closing the switching transistor Q31, the signal SBAR (equivalent to potential $V_{DD}$) turns on the n-channel MOSFET M41. At this point, the n-channel MOSFET M61 is already turned off by the signal S that precedes the signal SBAR by a time period corresponding to one inverter stage. However, because the p-channel MOSFET M51 remains on until the signal SBAR is input, the signal S does not cause the signal Z to fall.

In the manner described, the driving circuit $/D_1$ is controlled in operation by the signal S when opening the switching transistor Q31 and by the signal SBAR which lags behind the signal S when closing that transistor Q31.

The driving circuit $D_1$ in FIG. 2 is constituted by taking into account the symmetry of circuit layout. That is, the p-channel MOSFET M51 in the driving circuit $/D_1$ is replaced by a p-channel MOSFET M21 in the driving circuit $D_1$; the n-channel MOSFET M41, by an n-channel MOSFET M11; the n-channel MOSFET M61, by an n-channel MOSFET M31; the signal SBAR, by the signal S; and the signal SBAR, by the signal S.

Since the signal SBAR lags behind the signal S, the driving circuit $D_1$ is controlled in operation by the signal S when both opening and closing the switching transistor Q21.

Figure 3:
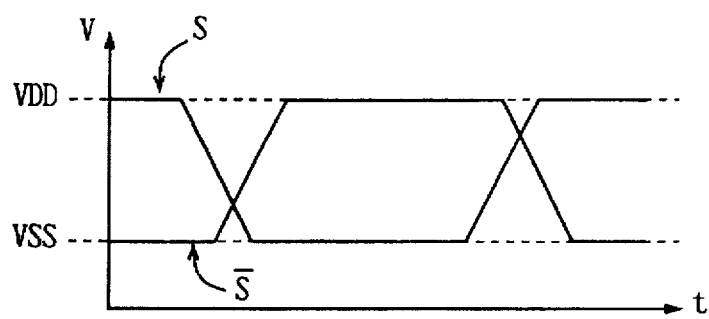
FIG. 3 is a timing chart of signals in effect when the first embodiment works.
Figure 4:
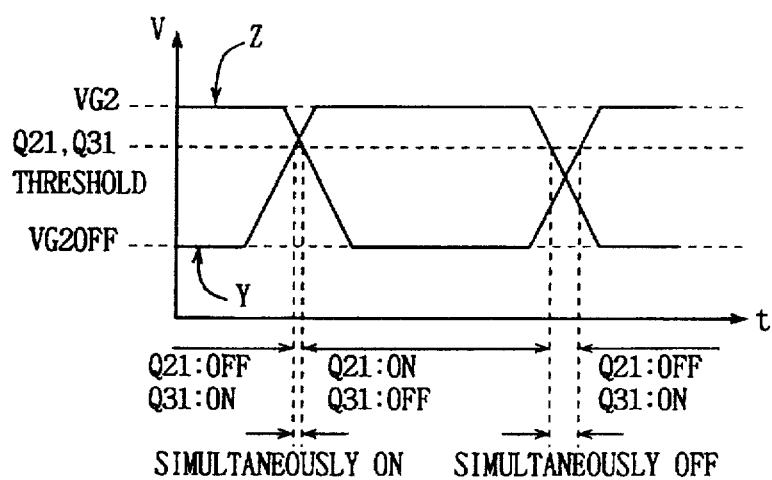
FIG. 4 is another timing chart of signals in effect when the first embodiment works.

FIG. 3 is a timing chart of the signals S and SBAR in effect when the first embodiment works. FIG. 4 is a timing chart of the signal Y output by the driving circuit $D_1$ and the signal Z output by the driving circuit $/D_1$. The two figures illustrate the signal behavior reflecting the circuit workings described above.

In FIG. 3, the signal SBAR is shown lagging behind the signal S by a time period corresponding to one inverter stage.

In FIG. 4, the fall of the signal Z lags behind the rise of the signal Y by a time period corresponding to one inverter stage. The cross point of the two signals is located higher than the median between these signals. On the other hand, with the rise of the signal Z and the fall of the signal Y controlled by the same signal S, there occurs no delay between the two signals. Thus the cross point of the signals Y and S coincides with the median therebetween.

Figure 37:
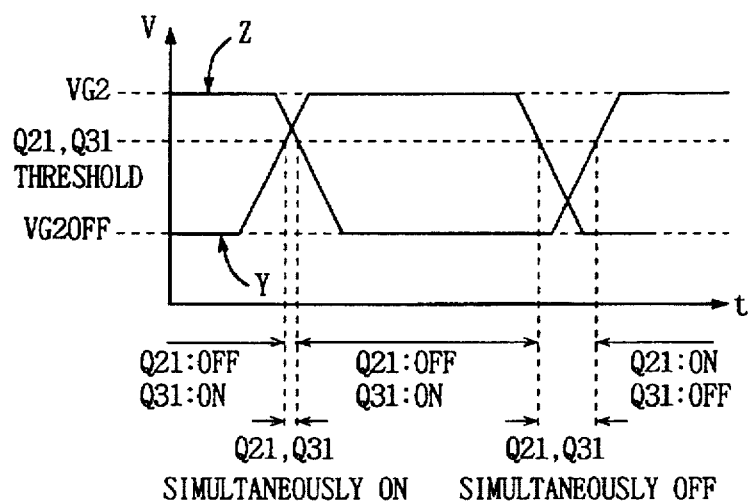
FIG. 37 is another timing chart of signals in effect when the first conventional converter works.
Figure 38:
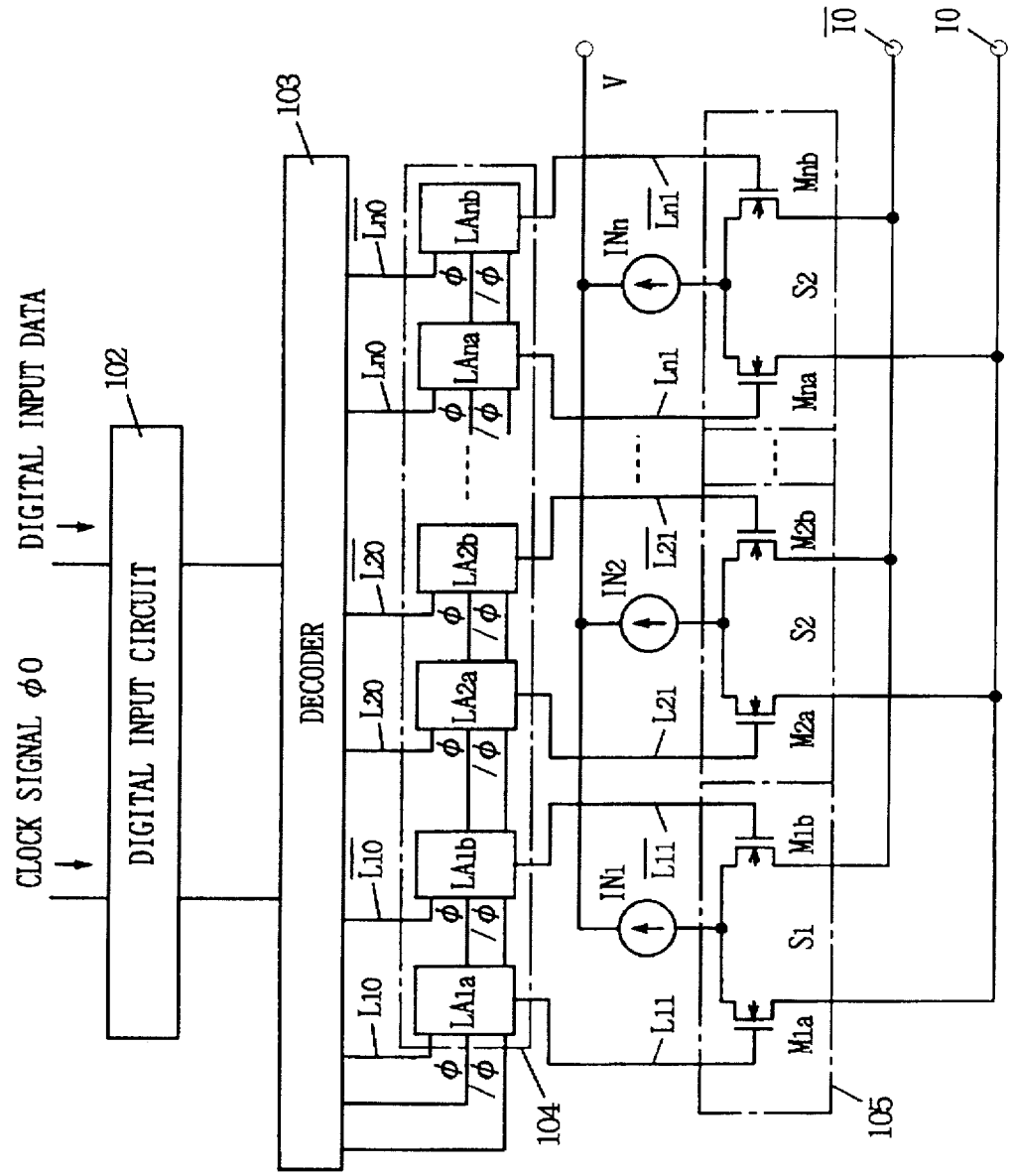
FIG. 38 is a schematic block diagram of a second conventional digital-analog converter.
Figure 39:
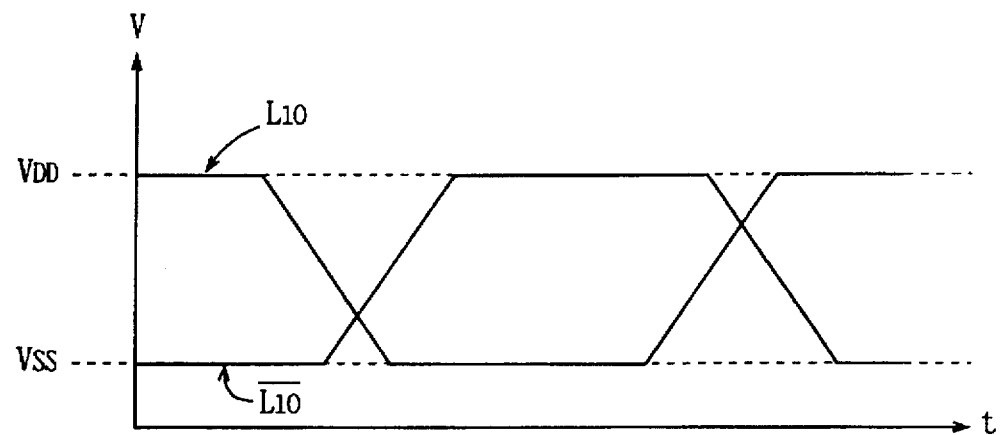
FIG. 39 is a timing chart of signals in effect when the second conventional converter works.
Figure 40:
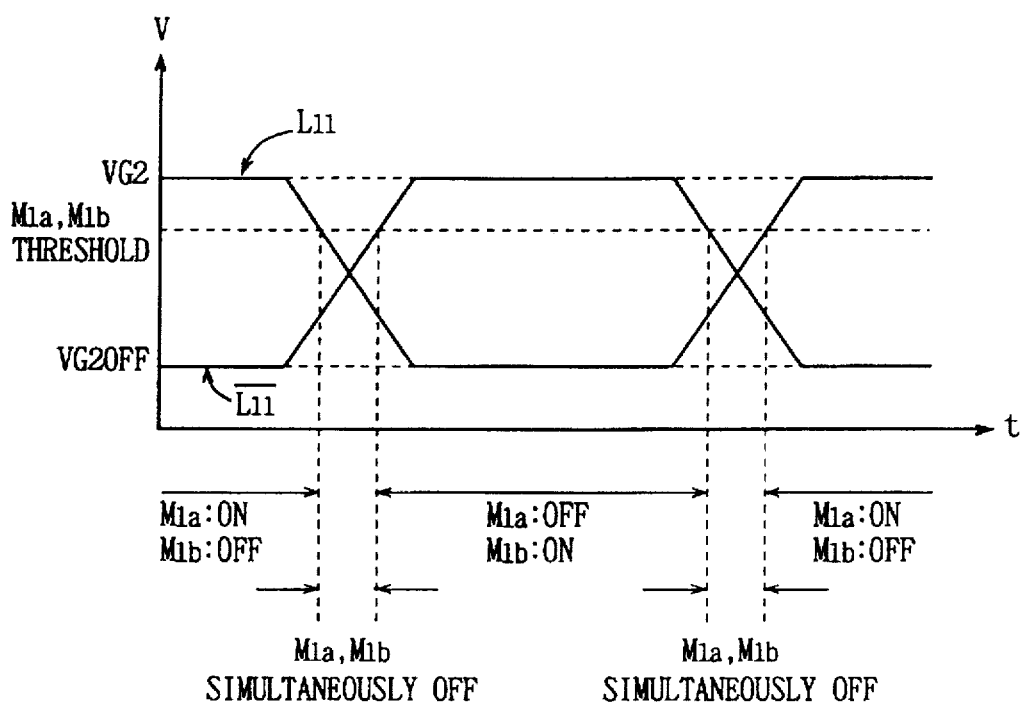
FIG. 40 is another timing chart of signals in effect when the second conventional converter works.

It follows that when the threshold value for the switching transistors Q21 and Q31 to open and close is greater than the median therebetween, the period of time in which the two switches are simultaneously turned off is shorter than that in the conventional setup of FIG. 37. This translates into a significant reduction in the occurrence of glitch.

Figure 5:
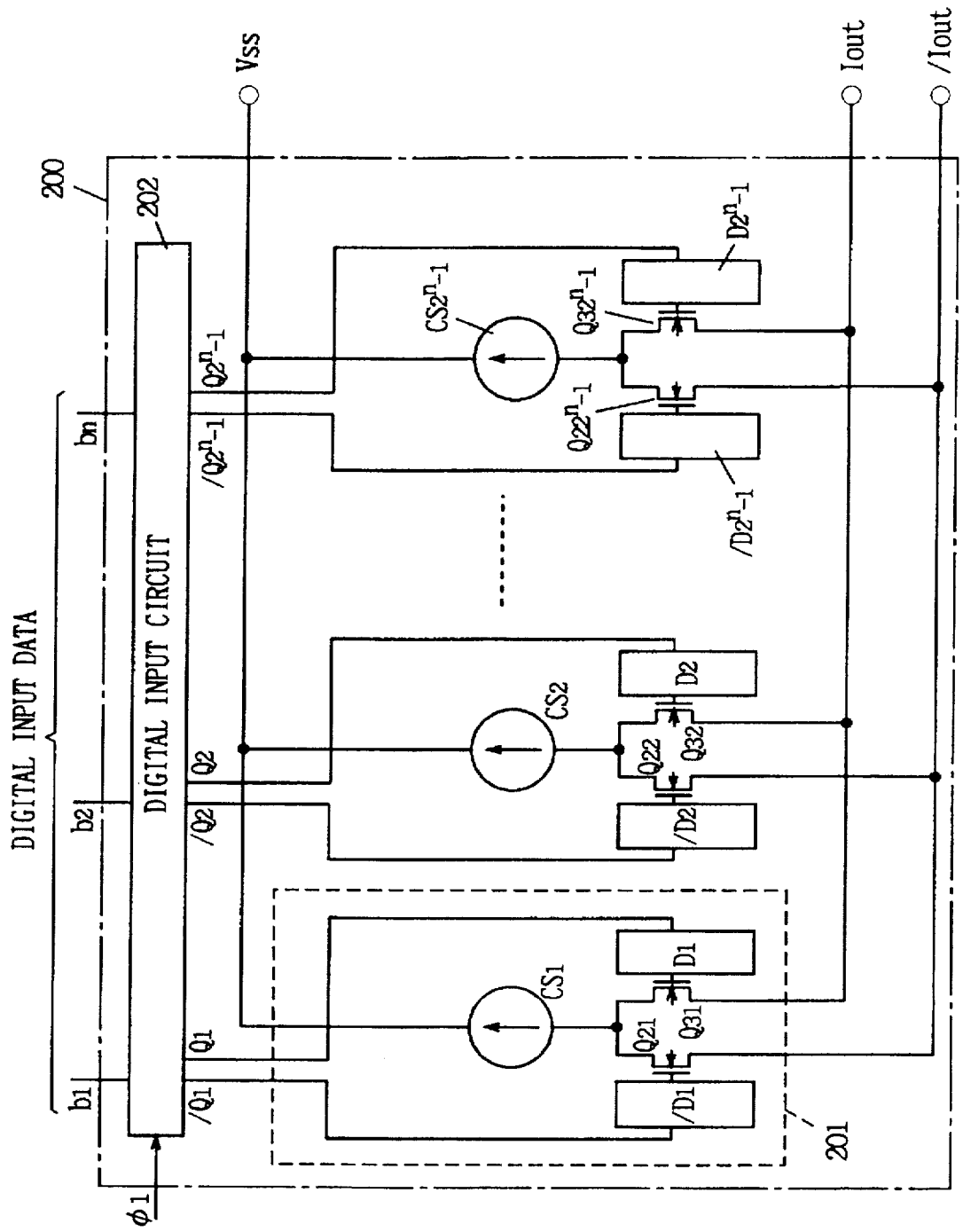
FIG. 5 is a schematic block diagram of a digital-analog converter practiced as a second embodiment of the invention.

FIG. 5 is a schematic block diagram of a segment type multiple current digital-analog converter practiced as the second embodiment of the invention. The second embodiment differs from the first embodiment in the following aspects:

A digital input signal {bi}(i=1, ..., n) to the second embodiment is decoded by a digital input circuit 202 producing a signal $Q_i$ and its inverted signal $/Q_i$ (i=1, 2, ..., $2^n-1$). The signals $Q_i$ and $/Q_i$ are output simultaneously to the driving circuits $D_i$ and $/D_i$, respectively, in accordance with the timing of the clock signal $\phi 1$.

Figure 6:
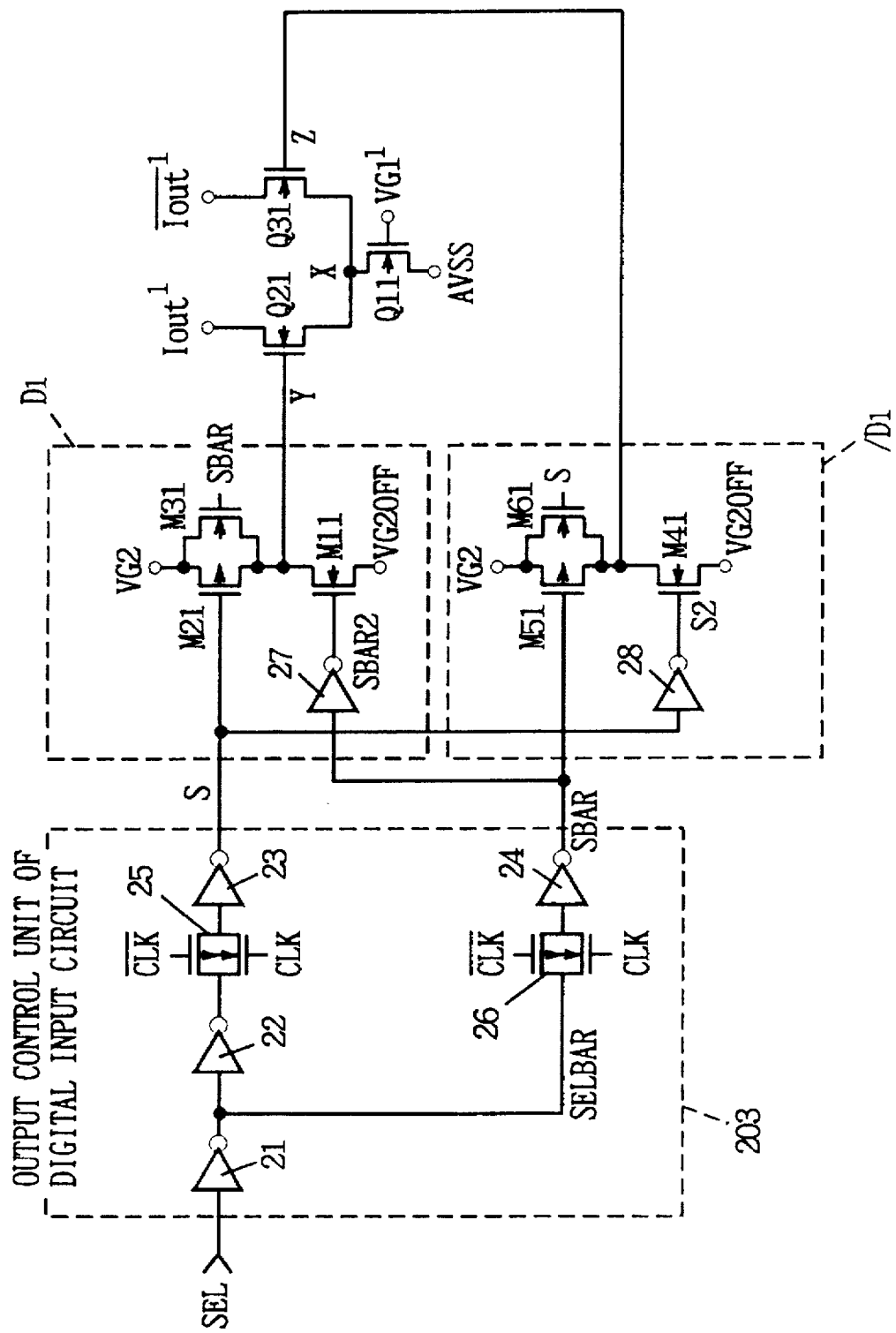
FIG. 6 is a circuit diagram of a unit current source cell in the second embodiment.

FIG. 6 is a circuit diagram of a unit current source cell 201 along with part of the input circuit 202 in the second embodiment. How the unit current source cell 201 works will now be described in more detail by referring to FIG. 6.

Reference characters SEL represent hereunder a decoded signal entered into an input circuit output control unit 203 that controls the output timing of the input circuit 202 using a clock signal arrangement. Reference characters S and SBAR denote respectively the signals $Q_i$ and $/Q_i$ which are output by the input circuit.

The output timing of the signal SEL entered into the input circuit output control unit 203 is determined by gates 25 and 26 controlled by a clock signal CLK. The signal SEL is inverted twice by inverters 21 and 22 before passing through the gate 25 in accordance with the timing of the clock signal CLK. Past the gate 25, the signal is further inverted by an inverter 23 and output as the signal S.

Meanwhile, the signal SEL is inverted by the inverter 21 to become a signal SELBAR that passes through the gate 26 in accordance with the timing of the clock signal CLK. Past the gate 26, the signal SELBAR is again inverted by an inverter 24 and output as the signal SBAR.

The driving circuit $D_1$ has the p-channel MOSFET M21 and n-channel MOSFET M11 connected in series through their common drain. The gate of the p-channel MOSFET M21 is supplied with the signal S, and the gate of the n-channel MOSFET M11 is fed with the signal acquired by an inverter 27 inverting the signal SBAR. An output signal Y from the common drain of the two transistors is input to the gate of the switching transistor Q21.

The driving circuit /$D_1$ has the p-channel MOSFET M51 and n-channel MOSFET M41 connected in series through their common drain. The gate of the p-channel MOSFET M51 is supplied with the signal SBAR, and the gate of the n-channel MOSFET M41 is fed with the signal acquired by an inverter 28 inverting the signal S. An output signal Z from the common drain of the two transistors is input to the gate of the switching transistor Q31.

FIG. 6 also includes the n-channel MOSFETs M31 and M61 in the circuit layout. This is to make the circuitry of FIG. 6 correspond in constitution to the equivalent layout of the first embodiment.

As described, the operations of the configured transistors do not affect directly the workings of the driving circuits $D_i$ and /$D_i$. This also holds true for the other embodiments to be described later.

The signals S and SBAR are supplied simultaneously according to the clock signal. Furthermore, the operation of the driving circuit $D_1$ is complementary to that of the driving circuit /$D_1$. What follows therefore is a description of the operation of the driving circuit $D_1$ alone.

When the driving circuit $D_1$ is to output a signal Y (potential VG2OFF) that closes the switching transistor Q21, a signal SBAR2 (corresponding to potential $V_{DD}$) lagging behind the signal SBAR by one inverter stage (inverter 27) turns on the n-channel MOSFET M11.

On the other hand, when the driving circuit $D_1$ is to output a signal Y (potential VG2) that opens the switching transistor Q21, the signal S (corresponding to potential $V_{SS}$) turns on the p-channel MOSFET M21.

This means that the driving circuit $D_1$ is controlled in operation by the signal S when opening the switching transistor Q21 and by the signal SBAR2 (lagging behind the signal S) when closing that transistor Q21.

Likewise, the driving circuit /$D_1$ is controlled in operation by the signal SBAR when opening the switching transistor Q31 and by a signal S2 lagging behind the signal SBAR when closing that transistor Q31.

Figure 7:
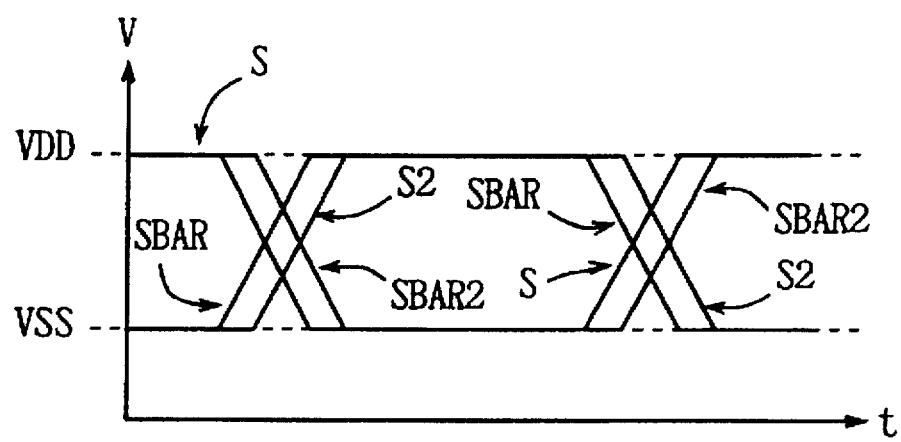
FIG. 7 is a timing chart of signals in effect when the second embodiment works.
Figure 8:
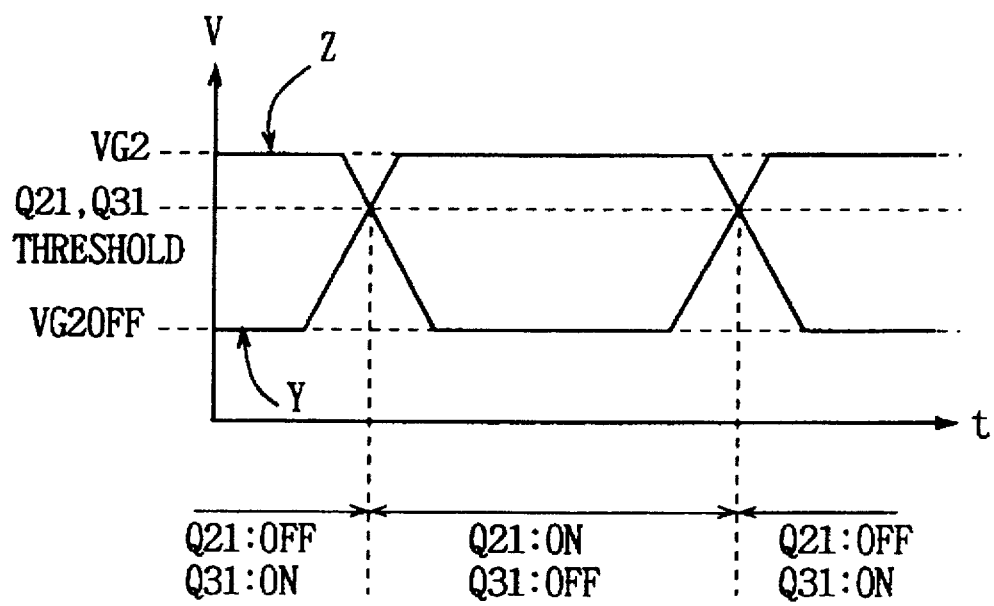
FIG. 8 is another timing chart of signals in effect when the second embodiment works.

FIG. 7 is a timing chart of the signals S, SBAR, S2 and SBAR2 in effect when the second embodiment works. FIG. 8 is a timing chart of the signal Y output by the driving circuit $D_1$ and the signal Z output by the driving circuit /$D_1$. The two figures illustrate the signal behavior reflecting the circuit workings described above.

The signal S2 is the inverted signal of the signal S and is delayed by a time period corresponding to one inverter stage. The signal SBAR2 is the inverted signal of the signal SBAR and is also delayed by a time period corresponding to one inverter stage. Thus these signals are related to one other as shown in FIG. 7.

The driving circuits $D_1$ and /$D_1$ each output the signal for closing the switching transistor later than the signal for opening it. The signals Y and Z are thus related to each other as shown in FIG. 8. The cross point of the signals Y and Z is located higher than the median between the high and low signal levels of these signals. Thus even when the threshold value for the switching transistors Q21 and Q31 to act is greater than the median therebetween, the cross point of the two signals may be arranged to coincide with their threshold value.

As a result, the period of time in which the two switches are simultaneously turned on or off is made considerably shorter than that in the conventional setup of FIG. 37. This translates into an appreciable reduction in the occurrence of glitch.

Figure 9:
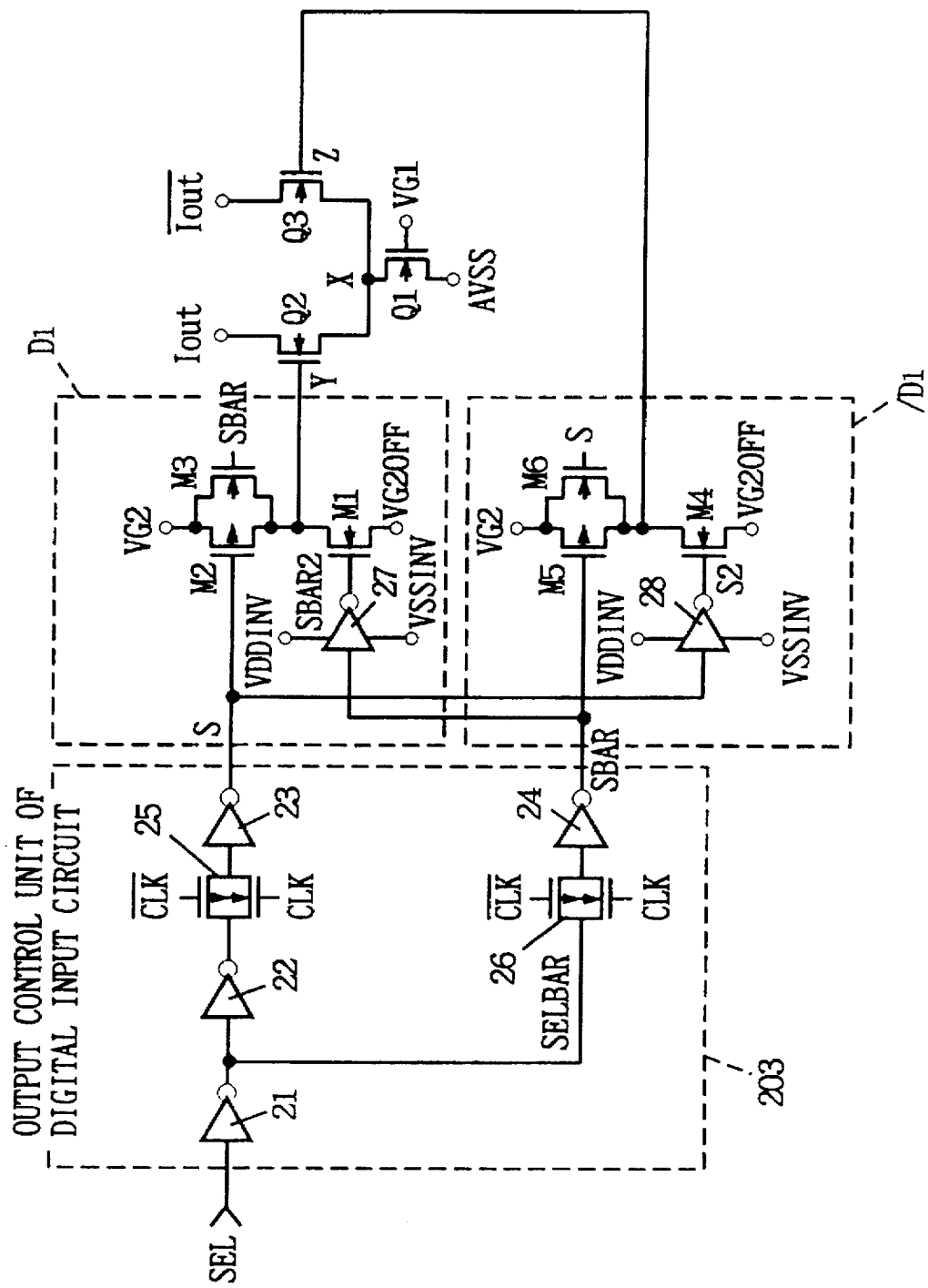
FIG. 9 is a circuit diagram of a unit current source cell in a third embodiment of the invention.

FIG. 9 is a circuit diagram of a unit current source cell constituting part of the third embodiment of the invention. The third embodiment is substantially the same in structure as the second embodiment of FIG. 6, except that at least one of the supply voltage and grounding potential for the inverters 27 and 28 is made variable with the third embodiment.

It is known that as the supply voltage increases, the delay time of the inverter is generally reduced monotonously. This characteristic, when suitably utilized, makes it possible to adjust the delay time for the signals Y and Z to fall as they are output by the driving circuits $D_1$ and /$D_1$.

Figure 10:
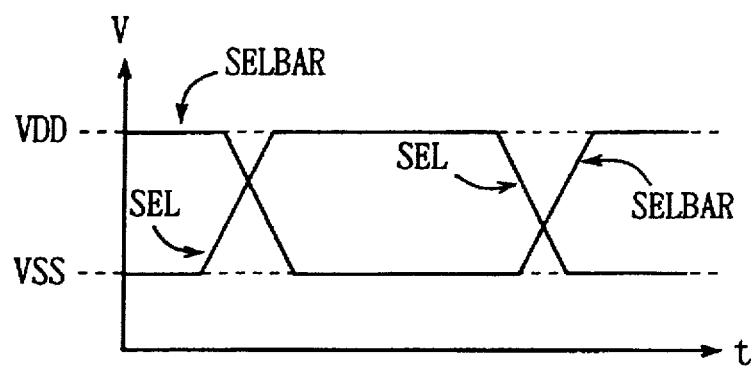
FIG. 10 is a first timing chart of signals in effect when the third embodiment works.
Figure 11:
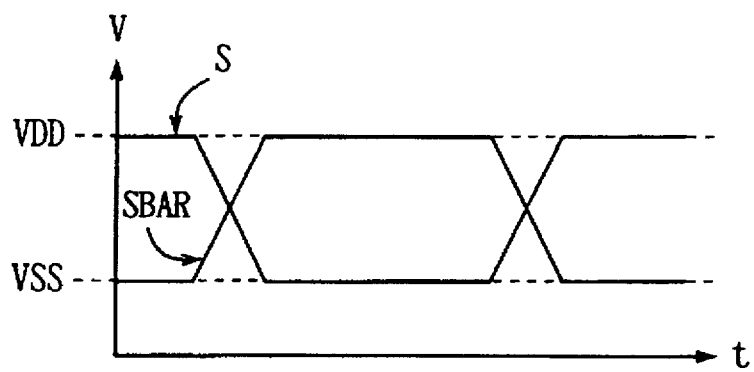
FIG. 11 is a second timing chart of signals in effect when the third embodiment works.
Figure 12:
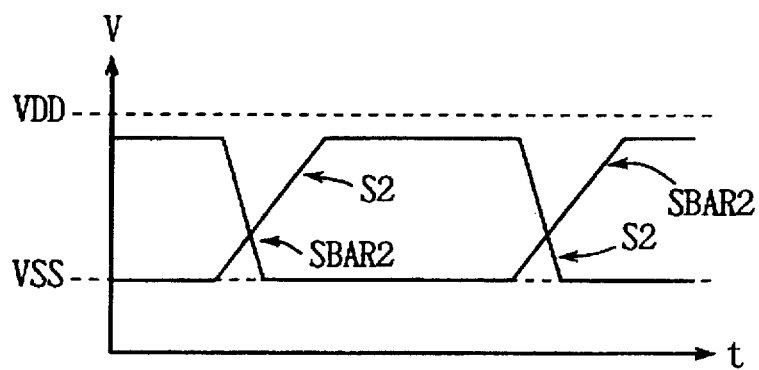
FIG. 12 is a third timing chart of signals in effect when the third embodiment works.

FIGS. 10 through 13 are timing charts of signals in effect when the third embodiment operates. The reference characters representing the signals are the same as those in FIGS. 7 and 8. In FIG. 10, the signal SELBAR lags behind the signal SEL by a time period corresponding to one inverter stage. In FIG. 11, the signals S and SBAR from the input circuit output control unit 203 are output after being synchronized by use of the clock signal CLK so that the two signals act with the same timing in a complementary manner. In FIG. 12, the supply voltage for the inverters 27 and 28 is reduced so that the rise of the signals S2 and SBAR2 is delayed.

The above-described aspects of the signal behavior stem from the operations outlined below centering illustratively on the signal S2. When the control signal S is driven Low from High, the logical threshold value of the inverter is lower than normal because the potential $V_{DD}$ of the inverter is reduced. That is, the p-channel MOSFET in the inverter is not turned on unless and until the level of the signal S becomes lower than normal. At this point, the n-channel MOSFET is almost turned off. This requires charging the load capacitance of the output node of the inverter using the p-channel MOSFET only. Hence the slowdown in the signal level change.

On the other hand, when the control signal S is brought High from Low, the p-channel MOSFET is immediately turned off because the potential $V_{DD}$ of the inverter is low. At this point, the n-channel MOSFET is turned on to extract the charges from the output node. Hence the tendency to hasten the fall in the signal level change.

However, the accelerated fall above in the signal level change leaves unaffected the signal Z in its rise. This is because the process in which the driving circuit /$D_1$ drives its output signal High from Low (equivalent to High from Low with the signal S) is controlled by the signal SBAR.

Figure 13:
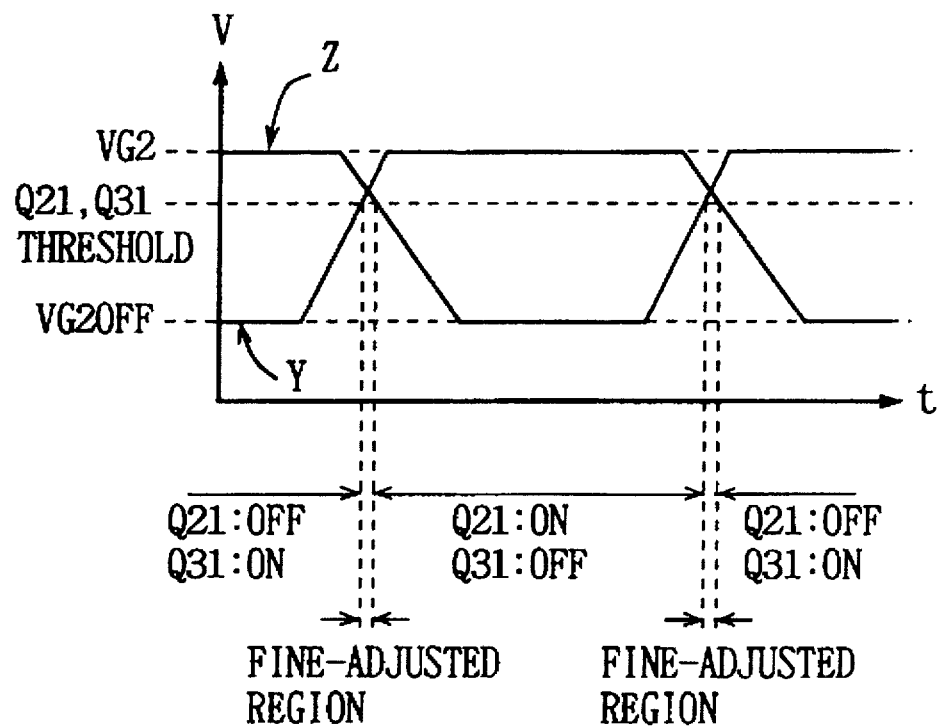
FIG. 13 is a fourth timing chart of signals in effect when the third embodiment works.

Therefore, the signals Y and Z output by the driving circuits under control of the signals S2 and SBAR2 are increasingly delayed at their trailing edge. As shown in FIG. 13, the waveforms of the signals Y and Z intersect at a level higher than the median therebetween. That is, lowering the power supply level of the inverters 27 and 28 delays the fall of the signals Y and Z. This, unlike in FIG. 8, makes the cross point of the signals Y and Z in FIG. 13 higher than the threshold value for the switching transistors Q21 and Q31.

Figure 14:
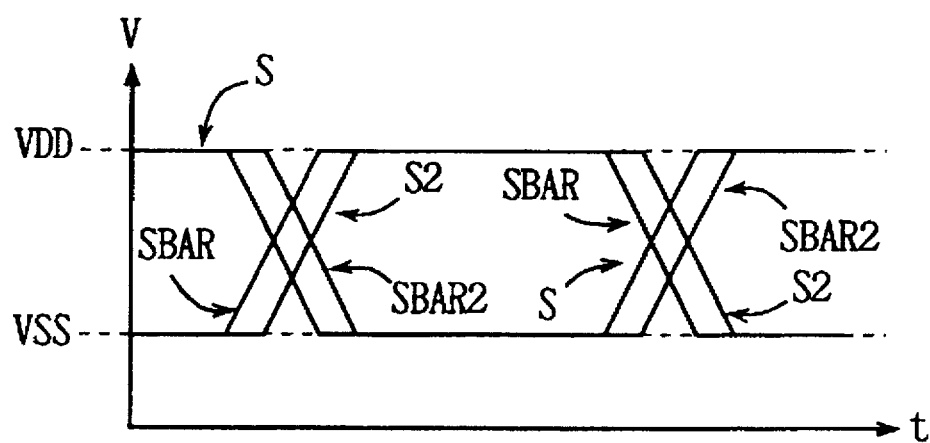
FIG. 14 is a fifth timing chart of signals in effect when the third embodiment works.
Figure 15:
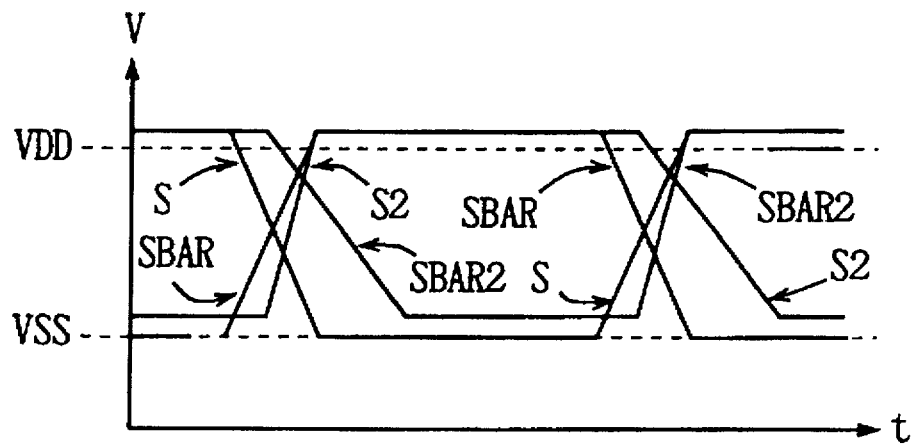
FIG. 15 is a sixth timing chart of signals in effect when the third embodiment works.
Figure 16:
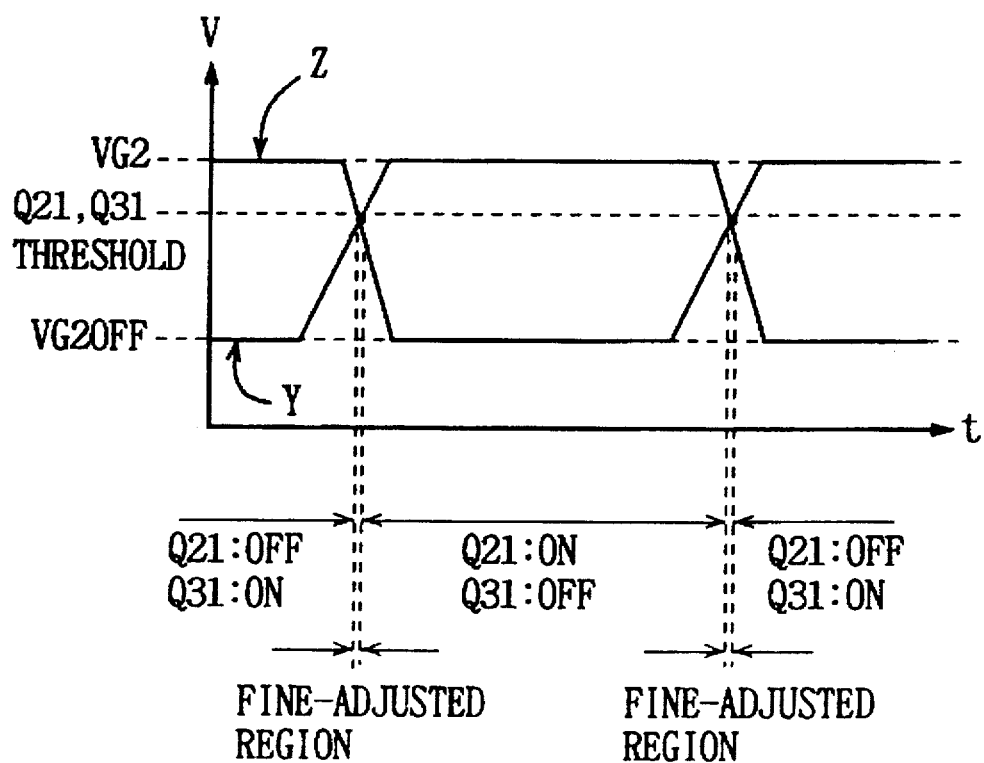
FIG. 16 is a seventh timing chart of signals in effect when the third embodiment works.

Given the above characteristics, FIGS. 15 and 16 show a comparative example in which the ground level of the inverter 28 is raised. FIG. 14 shows a case where the ground level is kept unchanged. As described earlier in connection with the reduction of the power supply level, the timing with which the signal S2 is raised, i.e., when the signal S is driven Low from High, need only be considered in order to study the signal Z from the driving circuit/$D_i$.

Raising the ground level causes the logical threshold value of the inverter to become higher than normal. That is, the p-channel MOSFET in the inverter is turned on at a level higher than that in effect when the level of the signal S is normal. Thus when the signal S is brought Low from High, the change in the output level of the inverter (i.e., rise of signal S2) is accelerated.

As a result, the signals Y and Z output by the driving circuits under control of the signals S2 and SBAR2 are less delayed at their trailing edge. As shown in FIG. 16, the waveforms of the signals Y and Z intersect at a level lower than the threshold value for the switching transistors Q21 and Q31, unlike in FIG. 8.

As described, the cross point of the signals Y and Z may be varied by lowering the power supply level of the inverters 27 and 28 or by raising the ground level. This makes it possible to let the cross point coincide with the threshold value of the switching transistors Q21 and Q31. The result is a considerable reduction in the occurrence of glitch.

Figure 17:
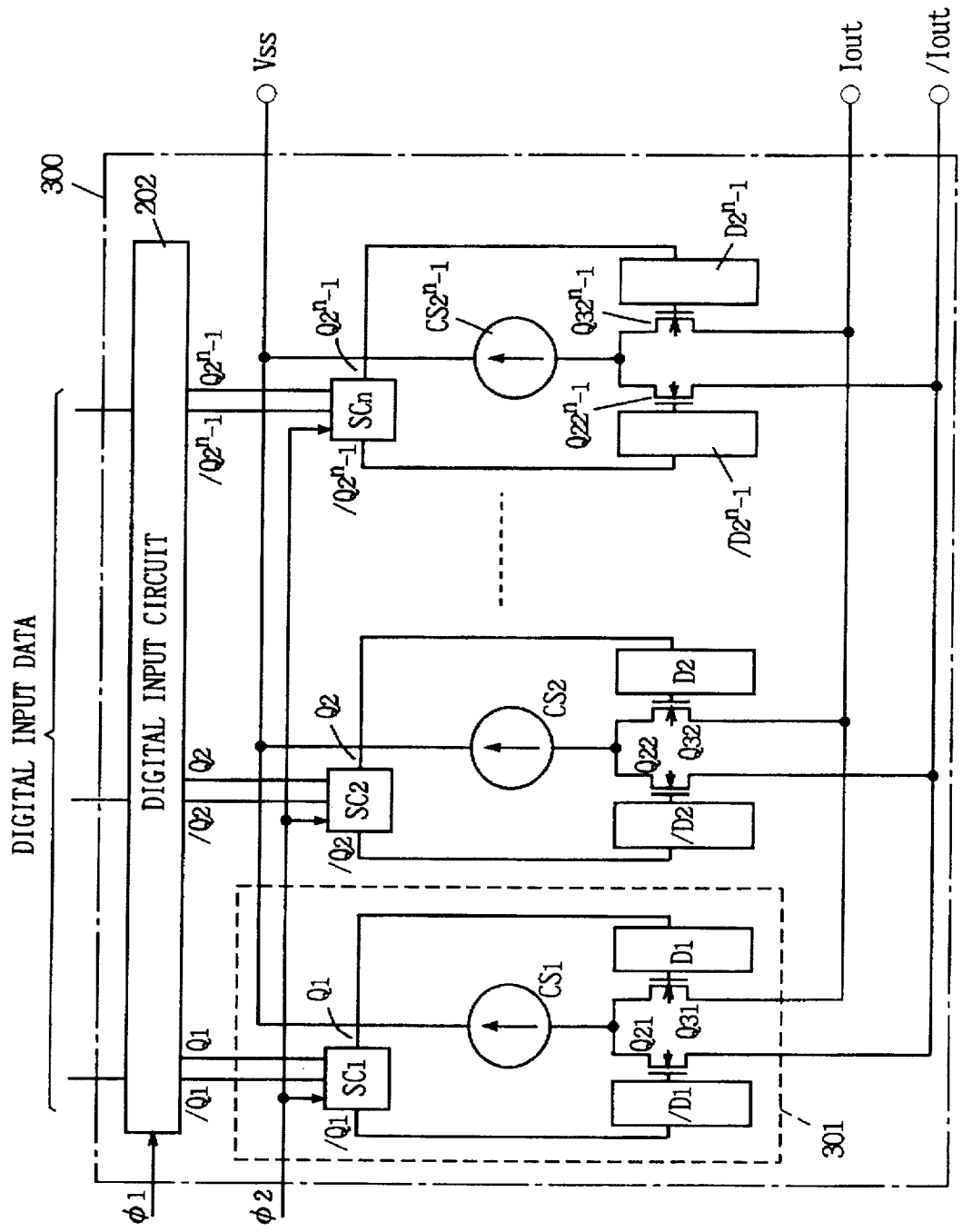
FIG. 17 is a schematic block diagram of a digital-analog converter practiced as a fourth embodiment of the invention.

FIG. 17 is a schematic block diagram of a segment type multiple current digital-analog converter practiced as the fourth embodiment of the invention. The fourth embodiment is different from the second embodiment (FIG. 5) in the following aspects:

The signal $Q_i$ and its inverted counterpart /$Q_i$ ($i=1, 2, \ldots, 2^n-1$) decoded and output by the digital input circuit 202 are input to a switch control circuit SCi. The switch control circuit SCi, controlled by a clock signal $\phi 2$, outputs control signals to the driving circuits $D_i$ and /$D_i$.

Figure 18:
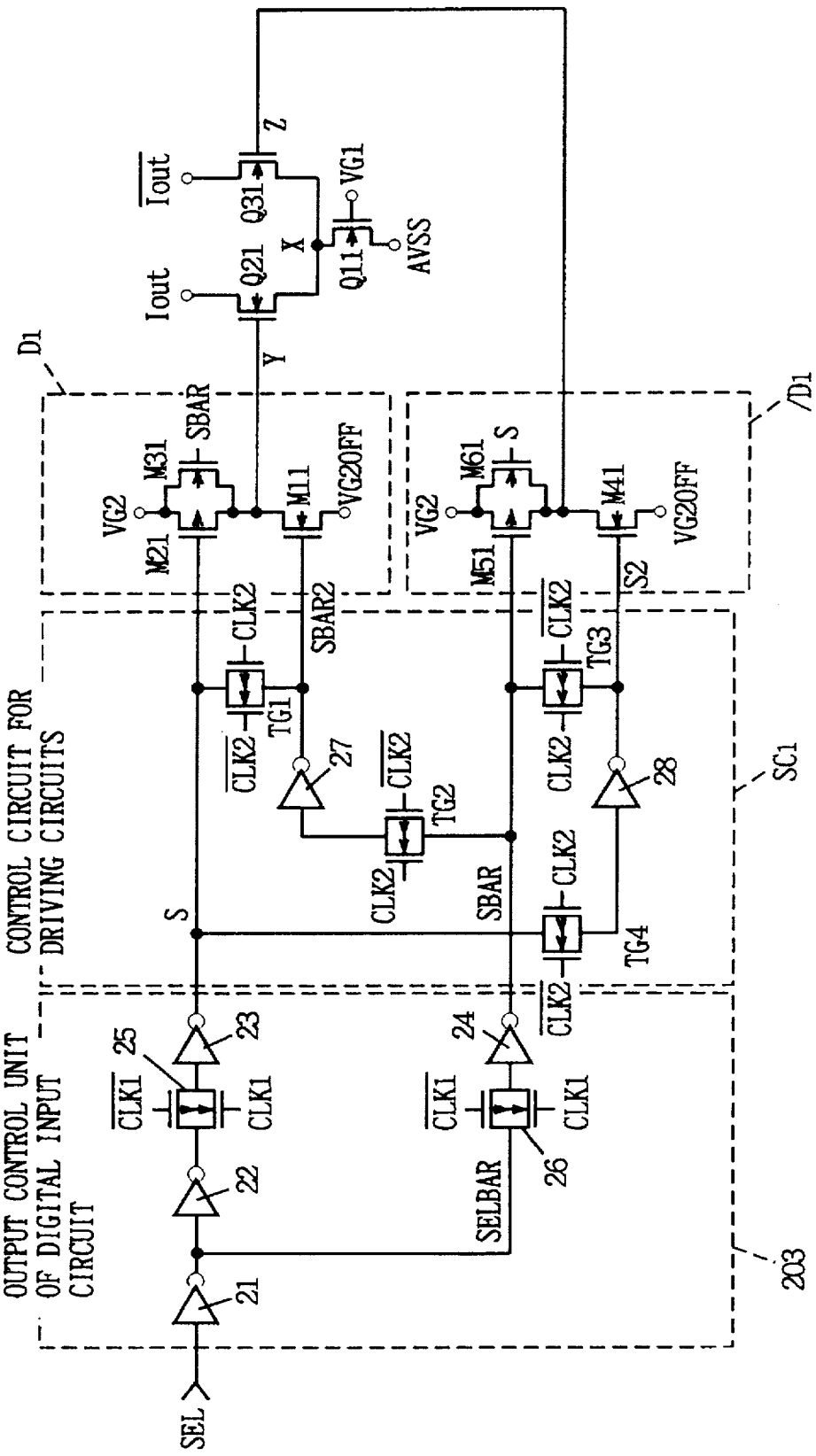
FIG. 18 is a circuit diagram of a unit current source cell in the fourth embodiment.

How a unit current source cell 301 of the fourth embodiment works will now be described with reference to FIG. 18. FIG. 18 is a circuit diagram comprising the unit current source cell 301 along with part of the input circuit 202 and the switch control circuit SCi. The reference characters SEL, SELBAR, S, S2, SBAR and SBAR2 denoting the signals are the same as those in FIG. 6.

The driving circuit $D_l$ has the drain of the p-channel MOSFET M21 and that of the n-channel MOSFET M11 connected in series. The gate of the p-channel MOSFET M21 is always supplied with the signal S.

The gate of the n-channel MOSFET M11 is fed with the signal S when a switch TG1 controlled by a clock signal CLK2 in the switch control circuit SC1 is turned on. The gate of the n-channel MOSFET M11 is supplied with the signal SBAR2 acquired by the inverter 27 inverting the signal SBAR when the switch TG1 is turned off and a switch TG2 is turned on. The switch TG2 is turned on and off by the clock signal CLK2 in a complementary manner with respect to the switch TG1.

The driving circuit /$D_1$ has the drain of the p-channel MOSFET M51 and that of the n-channel MOSFET M41 connected in series. The gate of the p-channel MOSFET M51 is always fed with the signal SBAR.

The gate of the n-channel MOSFET M41 is fed with the signal SBAR when a switch TG3 controlled by the clock signal CLK2 in the switch control circuit SC1 is turned on. The gate of the n-channel MOSFET M41 is supplied with the signal S2 acquired by the inverter 28 inverting the signal S when the switch TG3 is turned off and a switch TG4 is turned on. The switch TG4 is turned on and off by the clock signal CLK2 in a complementary manner with respect to the switch TG3.

The switches TG1, TG2, TG3 and TG4 operate as follows: the switches TG1 and TG4 are turned on and off in synchronism, and so are the switches TG2 and TG3. The two pairs of switches operate in a mutually complementary manner. Illustratively, when the driving circuit $D_1$ is to open the switching transistor Q21, the signal CLK2 opens the switch TG1 and closes the switch TG2 so as to feed the signal S to the gates of the p-channel MOSFET M21 and n-channel MOSFET M11.

On the other hand, when the driving circuit $D_1$ is to close the switching transistor Q21, the signal CLK2 closes the switch TG1 and opens the switch TG2 so that the signal S will be fed to the gate of the p-channel MOSFET M21 and that the signal SBAR2 acquired by the inverter 27 inverting the signal SBAR will be supplied to the gate of the n-channel MOSFET M11.

In the situation above, the timing for the driving circuit $D_1$ to close the switching transistor Q21, i.e., for the signal Y to be brought Low from High, lags behind the timing for the driving circuit $D_1$ to open the switching transistor Q21, i.e., for the signal Y to be driven High from Low, by a time period corresponding to one inverter stage.

Figure 19:
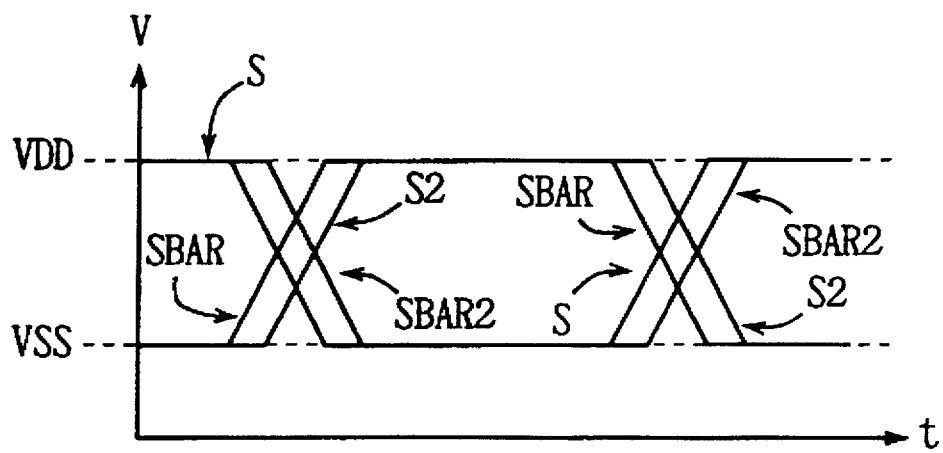
FIG. 19 is a first timing chart of signals in effect when the fourth embodiment works.
Figure 20:
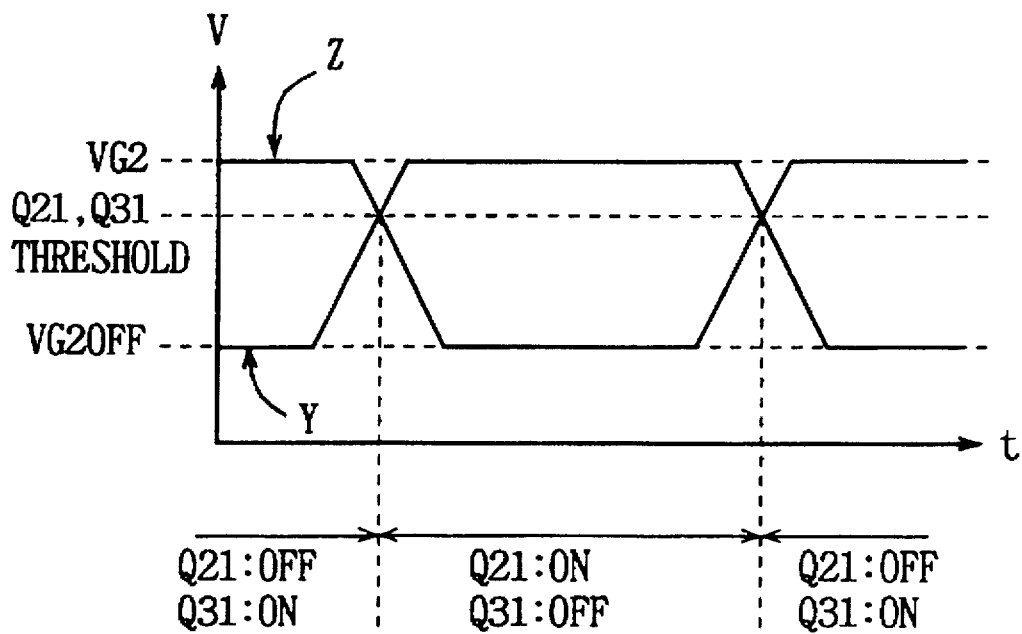
FIG. 20 is a second timing chart of signals in effect when the fourth embodiment works.

FIG. 19 is a timing chart of the signals S, S2, SBAR and SBAR2 in effect when the fourth embodiment operates. How the signals Z and Y behave is shown in FIG. 20. As illustrated, the signal S2 lags behind the signal S and the signal SBAR2 behind the signal SBAR by a time period corresponding to one inverter stage each.

Thus the fall of the signals Z and Y is controlled by the signals S2 and SBAR2, and their rise by the signals S and SBAR. This causes the cross point of the signals Z and Y to become higher than the median therebetween, as depicted in FIG. 20.

As a result, when the delay time of the inverter is suitably set, the cross point of the signals Z and Y may be adjusted to coincide with the threshold value of the switching transistors Q21 and Q31. This translates into a significant reduction in the period of time in which the two switches are turned on or off simultaneously, as compared with the conventional example in FIG. 37. Hence the decrease in the occurrence of glitch.

Figure 21:
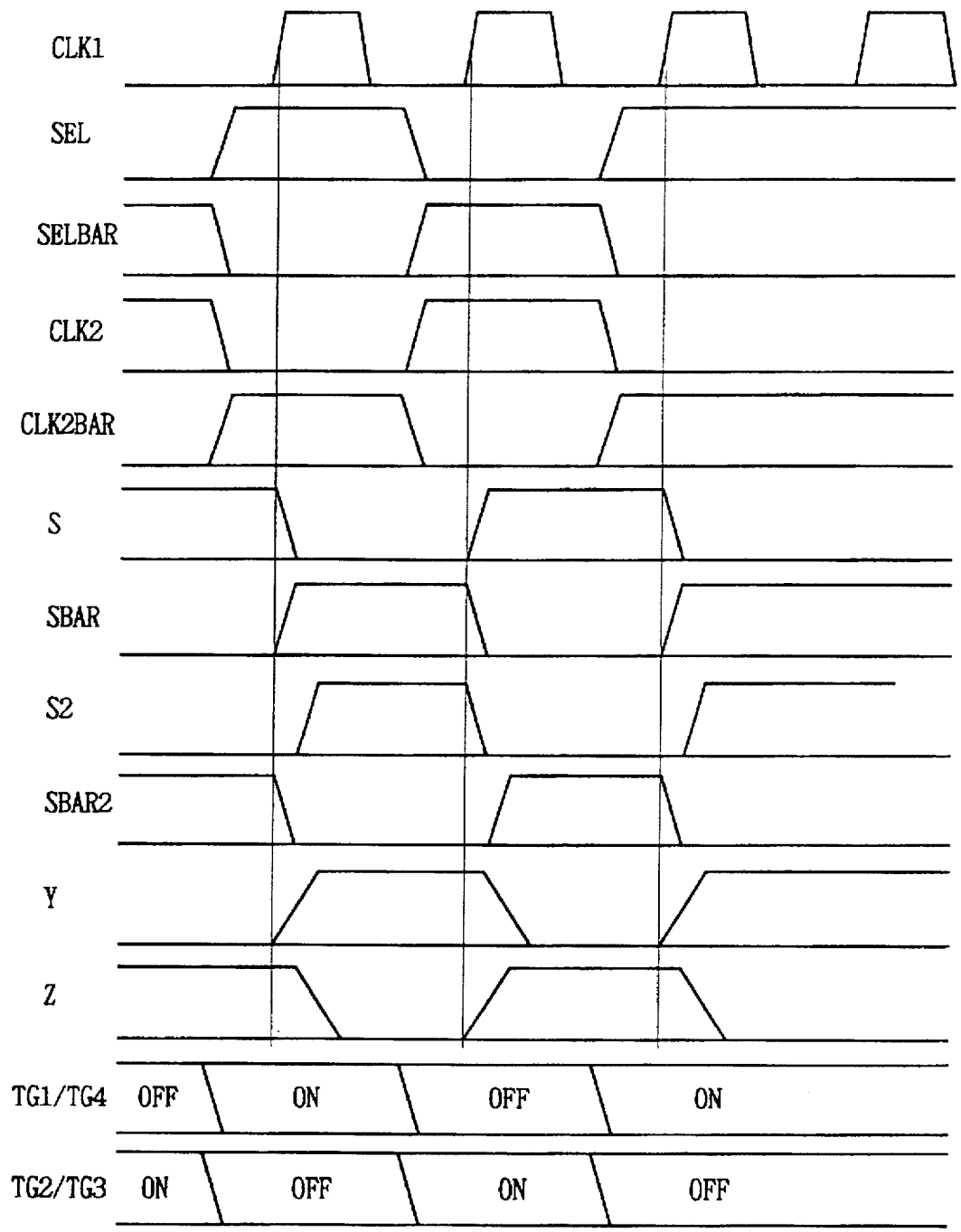
FIG. 21 is a third timing chart of signals in effect when the fourth embodiment works.

The workings above are summarized in the timing chart of FIG. 21. In FIG. 21, the input circuit output control unit 203 outputs the signal S or SBAR when the signal CLK1 is raised. The signal SELBAR is used unmodified as the signal CLK2, and the signal SEL is employed unchanged as the signal /CLK2.

How the fourth embodiment works will now be described briefly. After the externally supplied signals SEL and SEL-BAR are changed in their status, the signals S and SBAR are output by the input circuit output control unit 203 at a first leading edge of the signal CLK1. At the same time that the signals SEL and SELBAR are changed in their status, the pair of switches TG1 and TG4 and the pair of switches TG2 and TG3 are altered in their on-off status.

Illustratively, when the signal S is driven Low from High and the signal SBAR is brought High from Low, the switches TG1 and TG4 are turned on and the switches TG2 and TG3 are turned off. Thus the signal S2 for controlling the driving circuit /$D_1$ lags behind the signal S for controlling the driving circuit $D_1$. The signal Z falls later than the signal Y. Hence comes the signal behavior shown in the timing chart of FIG. 20.

Figure 22:
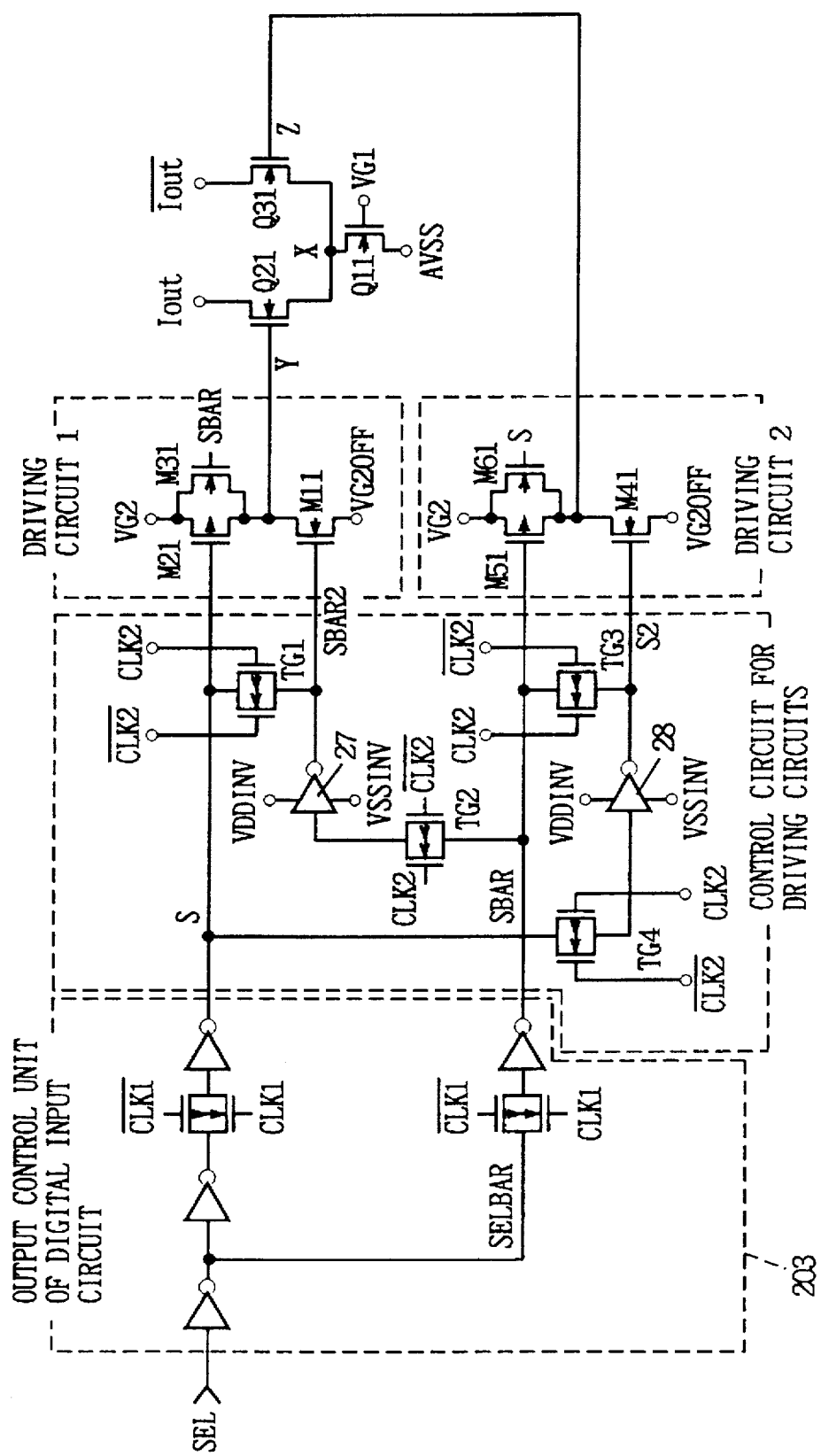
FIG. 22 is a circuit diagram of a unit current source cell in a fifth embodiment of the invention.

FIG. 22 is a circuit diagram of a unit current source cell together with an input circuit output control unit constituting part of the fifth embodiment of the invention. The fifth embodiment is substantially the same in structure as the fourth embodiment of FIG. 18, except that at least one of the supply voltage and grounding potential for the inverters 27 and 28 is made variable with the fifth embodiment.

That is, as with the third embodiment of FIG. 9, the fifth embodiment raises the cross point of the signals Y and Z by lowering the supply voltage of the inverters 27 and 28.

Conversely, the cross point of the signals Y and Z is lowered by raising the ground level of the inverters 27 and 28.

This makes it possible to let the cross point coincide with the threshold value of the switching transistors Q21 and Q31. The result is an appreciable reduction in the occurrence of glitch.

Figure 23:
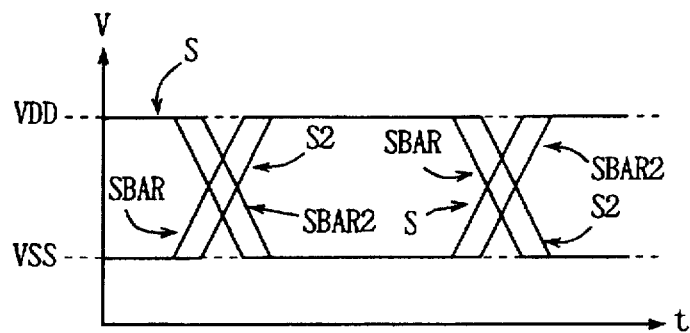
FIG. 23 is a first timing chart of signals in effect when the fifth embodiment works.
Figure 24:
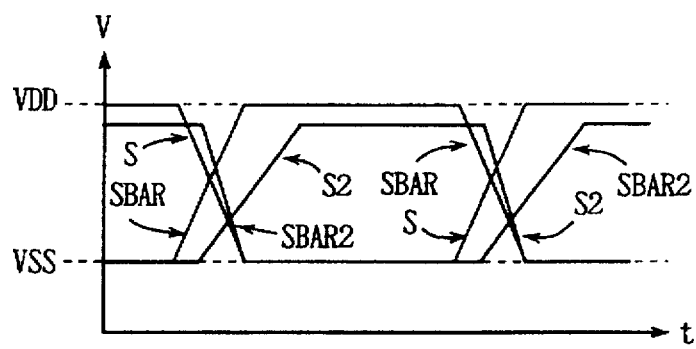
FIG. 24 is a second timing chart of signals in effect when the fifth embodiment works.
Figure 25:
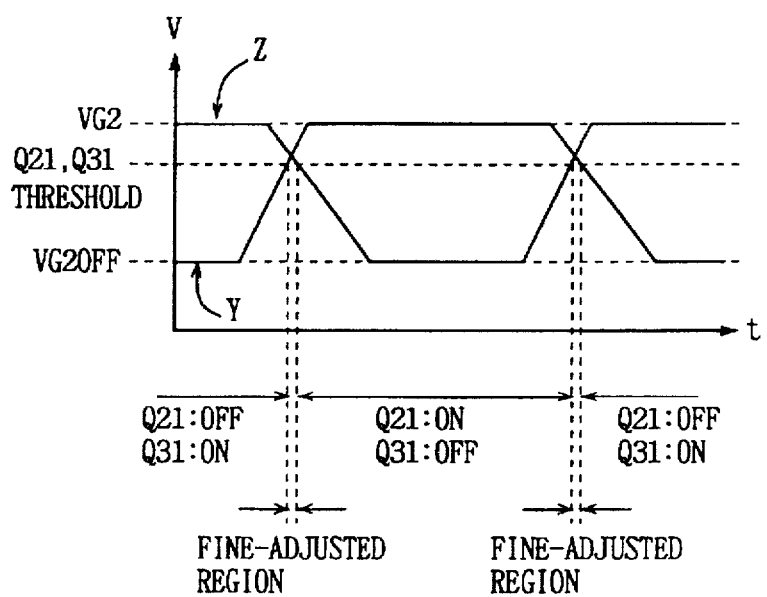
FIG. 25 is a third timing chart of signals in effect when the fifth embodiment works.

FIGS. 24 and 25 are timing charts of the signals S, S2, SBAR, SBAR2, Y and Z in effect when the power supply level for the inverters 27 and 28 is lowered in the fifth embodiment. FIG. 23 is a timing chart of the signals S, S2, SBAR and SBAR2 in effect when the power supply level for the inverters 27 and 28 is left unchanged for reference.

With the power supply level lowered as in the case of FIGS. 12 and 13, the signals Y and Z fall later than when the power supply level is left unchanged. Thus the cross point of the signals Y and Z becomes higher than the threshold value for the switching transistors Q21 and Q31, unlike in FIG. 8.

Figure 26:
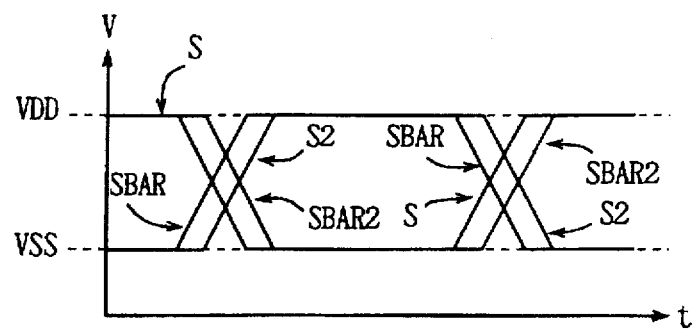
FIG. 26 is a fourth timing chart of signals in effect when the fifth embodiment works.
Figure 27:
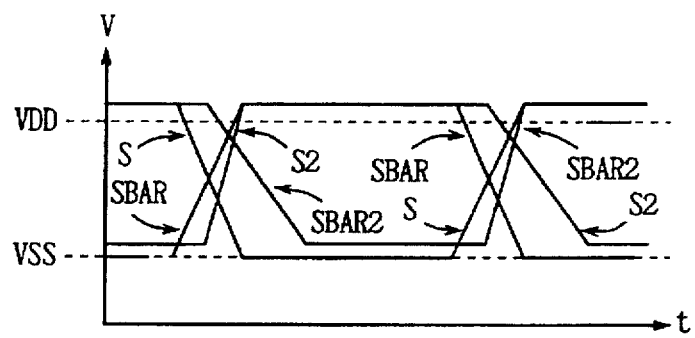
FIG. 27 is a fifth timing chart of signals in effect when the fifth embodiment works.
Figure 28:
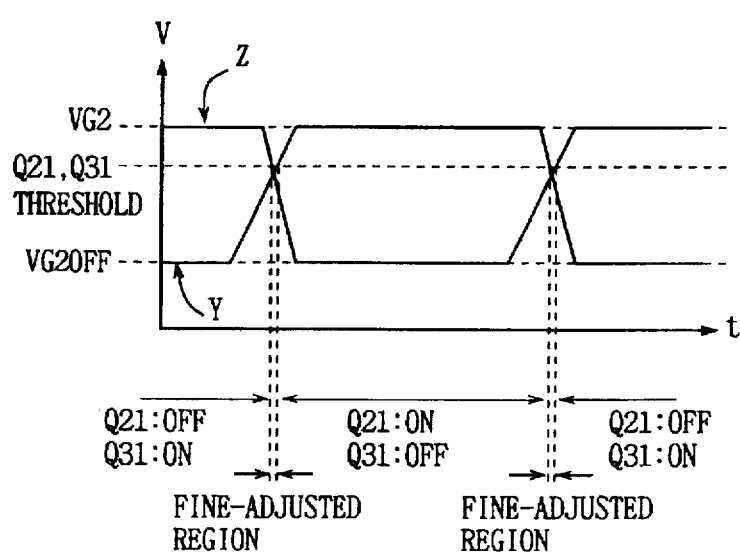
FIG. 28 is a sixth timing chart of signals in effect when the fifth embodiment works.
Figure 29:
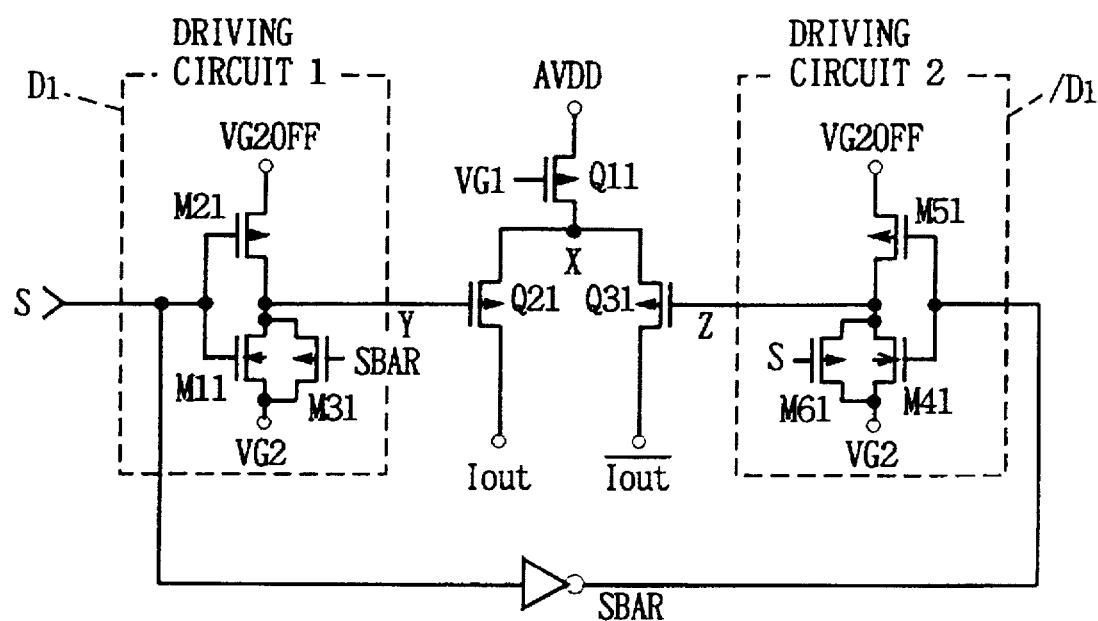
FIG. 29 is a circuit diagram of a p-channel MOSFET constituting a constant current source in the first embodiment.
Figure 30:
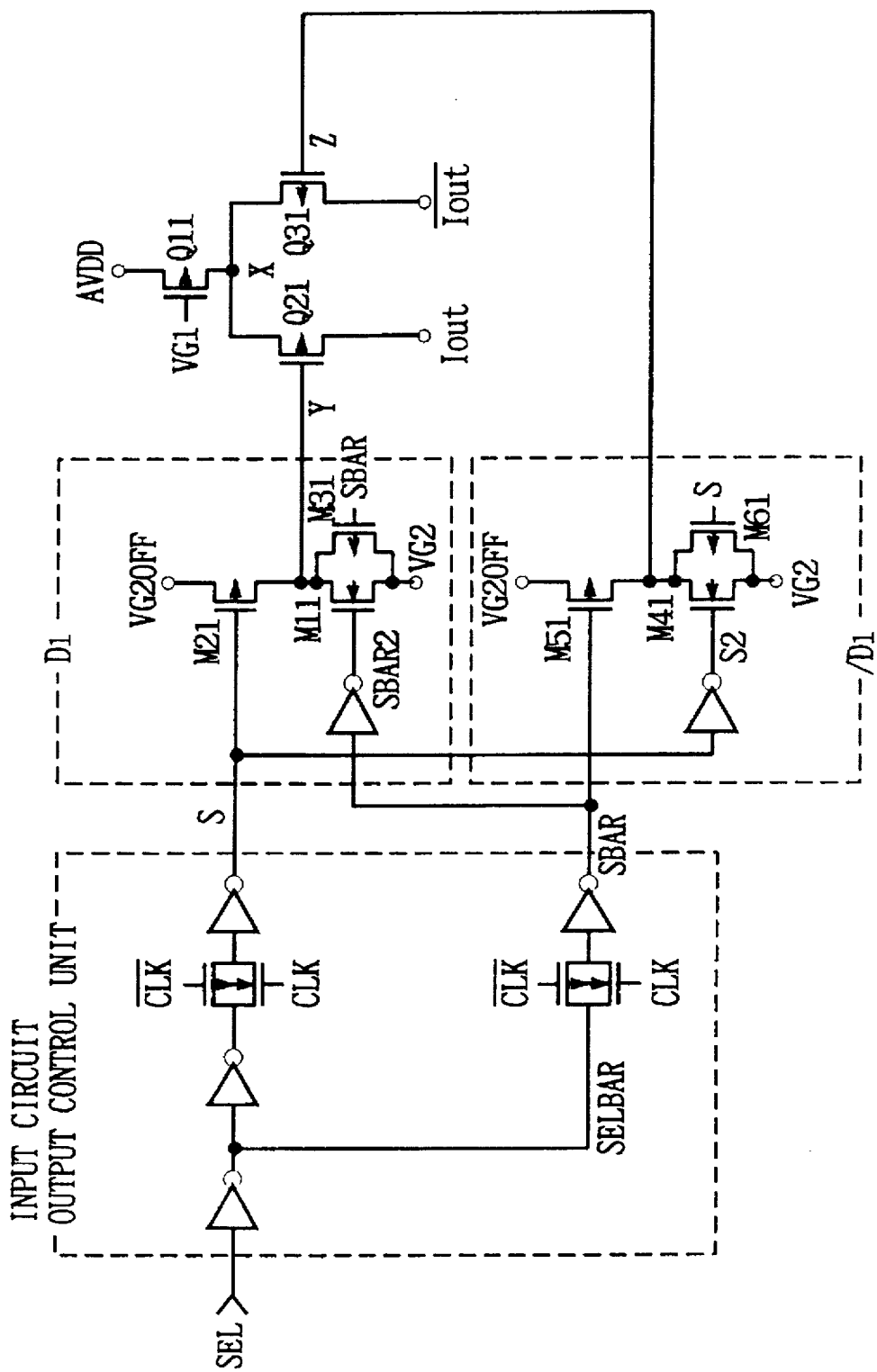
FIG. 30 is a circuit diagram of a p-channel MOSFET constituting a constant current source in the second embodiment.
Figure 31:
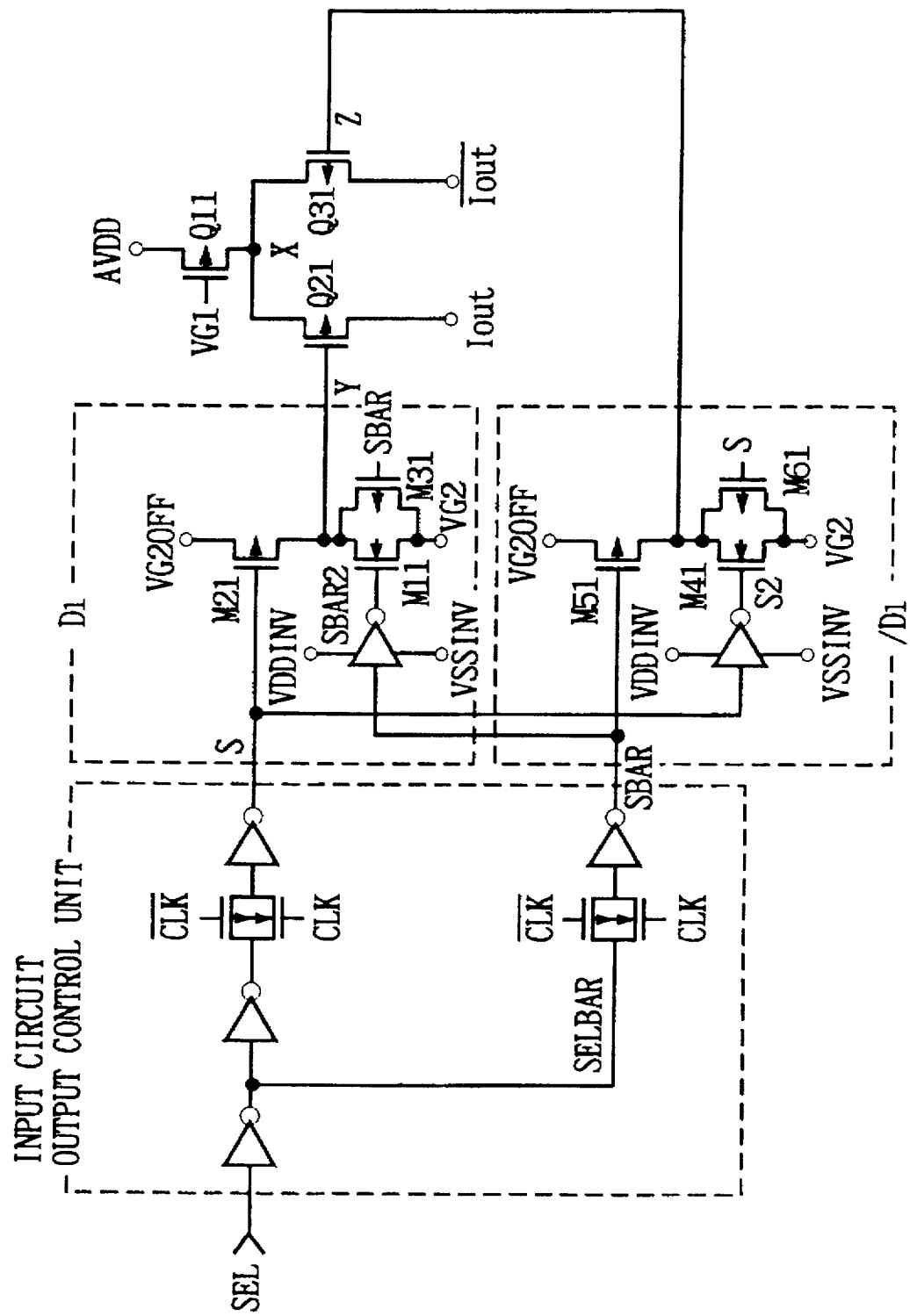
FIG. 31 is a circuit diagram of a p-channel MOSFET constituting a constant current source in the third embodiment.
Figure 32:
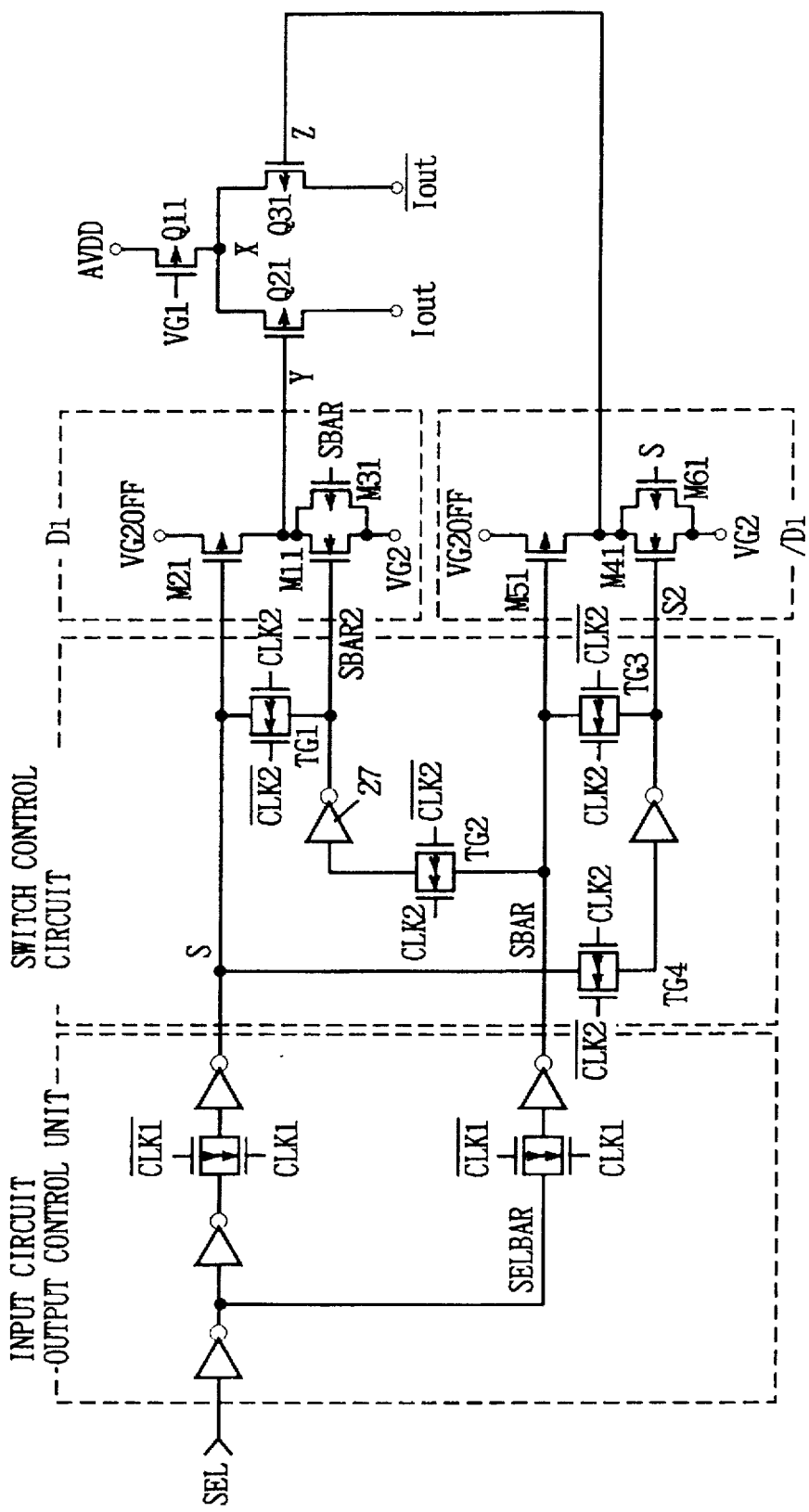
FIG. 32 is a circuit diagram of a p-channel MOSFET constituting a constant current source in the fourth embodiment.
Figure 33:
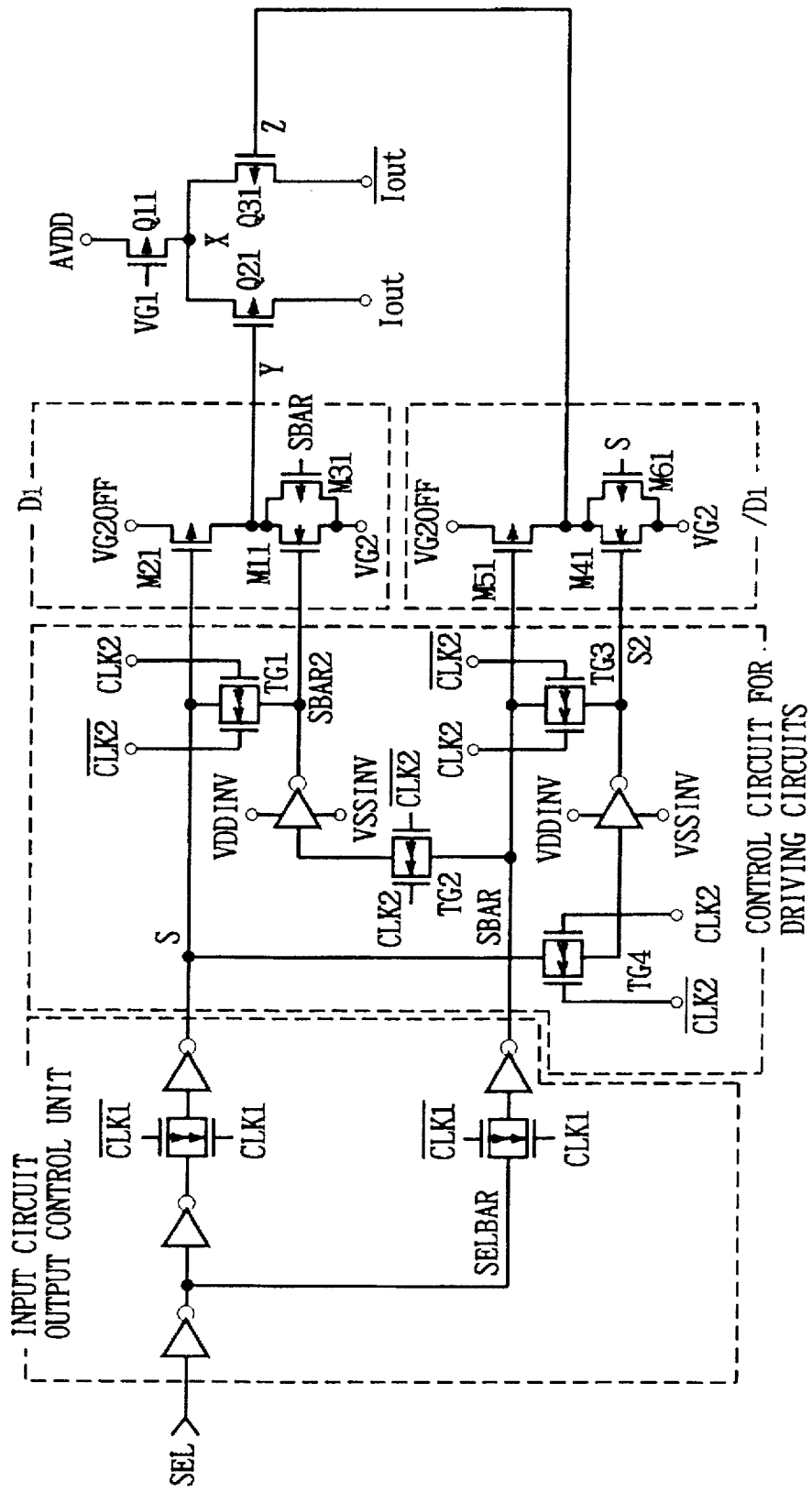
FIG. 33 is a circuit diagram of a p-channel MOSFET constituting a constant current source in the fifth embodiment.

On the other hand, FIGS. 27 and 28 are timing charts of signals S, S2, SBAR, SBAR2, Y and Z in effect when the ground level for the inverters 27 and 28 is raised in the fifth embodiment. FIG. 26 is a timing chart of the signals S, S2, SBAR and SBAR2 in effect when the ground level for the inverters 27 and 28 is left unchanged for reference.

With the ground level raised as in the case of FIGS. 15 and 16, the signals Y and Z fall earlier than when the ground level is left unchanged. Thus the cross point of the signals Y and Z becomes lower than the threshold value for the switching transistors Q21 and Q31, unlike in FIG. 8.

As described, the cross point of the signals Y and Z may be varied by lowering the power supply level of the inverters 27 and 28 or by raising the ground level thereof. This allows the cross point to coincide with the threshold value for the switching transistors Q21 and Q31. The result is a considerable reduction in the occurrence of glitch.

In the examples described above, the switching transistors Q21 and Q31 as well as the constant current driving transistor Q11 are all n-channel MOSFETs. However, this is not limitative of the invention. Alternatively, these transistors may all be p-channel MOSFETs, with the driving circuits $D_1$ and $/D_1$ acting in a complementary manner to each other. Such alternative circuits are shown in FIGS. 29 through 33. Specifically, the circuits in FIGS. 29, 30, 31, 32 an 33 correspond to the first, the second, the third, the fourth and the fifth embodiment, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiple current digital-analog converter for converting a digital input signal to a corresponding analog value current for output, comprising:

a plurality of unit current source cells; and current summing means for summing output currents from said unit current source cells;

wherein each of said unit current source cells includes:

a differential switch circuit including a first switch and a second switch;

a constant current source for outputting a constant current to said current summing means via said differential switch circuit;

a first driving circuit controlled by a corresponding bit signal of said digital input signal so as to open and close said first switch of said differential switch circuit;

an inverter for generating an inverted bit signal by inverting said corresponding bit signal; and a second driving circuit for closing and opening said second switch of said differential switch circuit in a complementary manner with respect to said first switch;

wherein the driving operation to open said second switch is controlled by said corresponding bit signal and the driving operation to close said second switch is controlled by said inverted bit signal.

2. A multiple current digital-analog converter according to claim 1, wherein said first switch of said differential switch circuit comprises a first MOS transistor of a first conductivity type and said second switch of said differential switch circuit comprises a second MOS transistor of the first conductivity type, each of the first MOS transistor and second MOS transistor having a source, drain and gate with the sources of said first MOS transistor and said second MOS transistor being connected in common;

said first driving circuit is an inverter having a third MOS transistor of a second conductivity type and a fourth MOS transistor of said first conductivity type connected in series, said third MOS transistor and said fourth MOS transistor being turned on and off in a complementary manner by said corresponding bit signal, each of the third MOS transistor and fourth MOS transistor having a source, drain and gate with the drains of said third MOS transistor and said fourth MOS transistor being connected in common and serving as the output of said first driving circuit;

said second driving circuit is an inverter having a fifth MOS transistor of said second conductivity type and a sixth MOS transistor of said first conductivity type connected in series, said fifth MOS transistor and said sixth MOS transistor being turned on and off in a complementary manner by said inverted bit signal, each of the fifth MOS transistor and sixth MOS transistor having a source, drain and gate with the drains of said fifth MOS transistor and said sixth MOS transistor being connected in common and serving as the output of said second driving circuit; and said second driving circuit includes a seventh MOS transistor of said first conductivity type and having a source, drain and gate, the seven MOS transistor being connected in parallel with said fifth MOS transistor, the drains and the sources of said seventh MOS transistor and said fifth MOS transistor being connected each other, said seventh MOS transistor being turned on and off by said corresponding bit signal.

3. A multiple current digital-analog converter according to claim 2, wherein said constant current source is an eighth MOS transistor of said first conductivity type and having a source, drain and gate, the drain of the eighth MOS transistor being connected to said first MOS transistor and said second MOS transistor, the gate of the eighth MOS transistor being supplied with a predetermined potential.

4. A multiple current digital-analog converter for converting a digital input signal having a plurality of bits to a corresponding analog value current for output, comprising:

a plurality of unit current source cells; and current summing means for summing output currents from said unit current source cells;

wherein each of said unit current source cells includes:

signal output and holding means for receiving each corresponding bit signal of said digital input signal before an arrival of a first external timing signal and for outputting the corresponding bit signal and an inverted bit signal acquired by inverting said corresponding bit signal after the arrival of said first external timing signal while simultaneously holding the corresponding bit signal and the inverted bit signal;

a differential switch circuit including a first switch and a second switch;

a constant current source for outputting a constant current to said current summing means via said differential switch circuit; and a first driving circuit and a second driving circuit each controlled by said corresponding bit signal and the inverted bit signal respectively in order to open and close said first switch and said second switch of said differential switch circuit in a complementary manner so that a delay time for the switch closing operation will be longer than delay time for the switch opening operation.

5. A multiple current digital-analog converter according to claim 4, wherein each of said first driving circuit and said second driving circuit includes:

a first MOS transistor of a first conductivity type and a second MOS transistor of a second conductivity type connected in series, each of the first MOS transistor and second MOS transistor having a source, drain and gate with and an inverter having an output connected to the gate of said second MOS transistor of said second conductivity type;

each of said first driving circuit and said second driving circuit opens its corresponding switch when said first MOS transistor is turned on and said second MOS transistor is turned off;

each of said first driving circuit and said second driving circuit closes its corresponding switch when said first MOS transistor is turned off and said second MOS transistor is turned on;

said first MOS transistor of said first driving circuit is controlled by said bit signal and said second MOS transistor thereof is controlled by the signal acquired by said inverter inverting said inverted bit signal; and said first MOS transistor of said second driving circuit is controlled by said inverted bit signal and said second MOS transistor thereof is controlled by the signal acquired by said inverter inverting said bit signal.

6. A multiple current digital-analog converter according to claim 5, wherein said first switch of said differential switch circuit comprises a third MOS transistor of the first conductivity type and said second switch of said differential switch circuit comprises a fourth MOS transistor of said first conductivity type, each of the third MOS transistor and fourth MOS transistor having a source, drain and gate with the sources of said third and said fourth MOS transistor being connected in common.

7. A multiple current digital-analog converter according to claim 6, wherein said constant current source is a fifth MOS transistor of said first conductivity type having a source, drain and gate with the drain of of the fifth MOS transistor connected to the common source of said third MOS transistor and said fourth MOS transistor, the gate of the fifth MOS transistor being supplied with a predetermined potential.

8. A multiple current digital-analog converter according to claim 4, wherein the delay time of said first driving circuit and said second driving circuit closing said first and said second switch is varied by an external signal.

9. A multiple current digital-analog converter according to claim 5, further comprising a first supply potential and a second supply potential for driving said inverters in said first driving circuit and said second driving circuit, wherein at least one of the first supply potential and the second supply potential for driving said inverters in said first and second driving circuit is variable.

10. A multiple current digital-analog converter for converting a digital input signal having a plurality of bits to a corresponding analog value current for output, comprising:

a plurality of unit current source cells; and current summing means for summing output currents from said unit current source cells;

wherein each of said unit current source cells includes:

signal output and holding means for receiving each bit signal of said digital input signal before an arrival of a first external timing signal and for outputting the corresponding bit signal and an inverted bit signal acquired by inverting said corresponding bit signal after the arrival of said first external timing signal while simultaneously holding the corresponding bit signal and the inverted bit signal;

signal output and holding means for receiving each a differential switch circuit including a first switch and a second switch;

a constant current source for outputting a constant current to said current summing means via said differential switch circuit;

a first driving circuit and a second driving circuit controlled by said corresponding bit signal and the inverted bit signal respectively in order to open and close said first switch and said second switch of said differential switch circuit in a complementary manner; and driving circuit control means including two transmission routes with different delay time from each other for transmitting said corresponding bit signal and said inverted bit signal to said first driving circuit and said second driving circuit respectively, said driving circuit control means switching relative to said first driving circuit and said second driving circuit said two transmission routes in a complementary manner in response to a second external timing signal.

11. A multiple current digital-analog converter according to claim 10, wherein each of said first and said second driving circuit includes a first MOS transistor and a second MOS transistor connected in series;

each of said first driving circuit and said second driving circuit opens its corresponding switch when said first MOS transistor is turned on and said second MOS transistor is turned off;

each of said first driving circuit and said second driving circuit closes its corresponding switch when said first MOS transistor is turned off and said second MOS transistor is turned on;

said driving circuit control means includes switching means for switching relative to said first driving circuit and said second driving circuit said transmission routes in a complementary manner in response to said second external timing signal;

a first transmission route of said two transmission routes transmits one signal of said corresponding bit signal and said inverted bit signal unchanged to said first MOS transistor and said second MOS transistor;

a second transmission route of said two transmission routes transmits said one bit signal unchanged to said first MOS transistor and transmits to said second MOS transistor a signal acquired by inverting the inverted bit signal via an inverter; and said switching means selects said first signal transmission route when either said first driving circuit or said second driving circuit opens the corresponding switch from a closed state, and selects said second transmission route when either said first driving circuit or said second driving circuit closes the corresponding switch from an opened state.

12. A multiple current digital-analog converter according to claim 11, wherein said second external timing signal comprises a first signal and a second signal acting in a complementary manner, and wherein said switching means includes a transmission gate driven by said first signal and said second signal.

13. A multiple current digital-analog converter according to claim 11, wherein said first switch of said differential switch circuit comprises a first MOS transistor of a first conductivity type and said second switch of said differential switch circuit comprises a fourth MOS transistor of the first conductivity type, each of the first MOS transistor and second MOS transistor having a source, drain and gate with the sources of said third MOS transistor and said fourth MOS transistor being connected in common.

14. A multiple current digital-analog converter according to claim 11, wherein said constant current source is a fifth MOS transistor of said first conductivity type having a source, drain and gate with the drain of the fifth MOS transistor connected to the common source of said third MOS transistor and said fourth MOS transistor, the gate of said fifth MOS transistor being supplied with a predetermined potential.

15. A multiple current digital-analog converter according to claim 10, wherein the delay time of said driving circuit control means for closing said first switch and said second switch is varied by an external signal.

16. A multiple current digital-analog converter according to claim 11, further comprising a first supply potential and a second supply potential for driving said inverters in said second transmission route, wherein at least one of the first supply potential and the second supply potential for driving said inverters in said second transmission route is variable.

* * * * *